(12) United States Patent
Lee et al.

(10) Patent No.: US 10,423,022 B2
(45) Date of Patent: Sep. 24, 2019

(54) LIGHT SHIELDING APPARATUS, METHOD OF FABRICATING THE SAME, AND TRANSPARENT DISPLAY DEVICE INCLUDING THE SAME

(71) Applicant: LG DISPLAY CO., LTD., Seoul (KR)

(72) Inventors: Moon Sun Lee, Chungcheongnam-Do (KR); Ji Young Ahn, Goyang-si (KR); Pu Reum Kim, Incheon (KR); Ki Han Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 367 days.

(21) Appl. No.: 14/724,340

(22) Filed: May 28, 2015

(65) Prior Publication Data
US 2015/0349028 A1    Dec. 3, 2015

(30) Foreign Application Priority Data

May 29, 2014 (KR) .................. 10-2014-0065085
Apr. 28, 2015 (KR) .................. 10-2015-0060036

(51) Int. Cl.
| | |
|---|---|
| *G02F 1/1333* | (2006.01) |
| *G02F 1/1334* | (2006.01) |
| *H01L 27/32* | (2006.01) |
| *G02F 1/1335* | (2006.01) |
| *G02F 1/1347* | (2006.01) |

(52) U.S. Cl.
CPC ........ *G02F 1/1334* (2013.01); *G02F 1/13475* (2013.01); *G02F 1/133502* (2013.01); *H01L 27/32* (2013.01); *G02F 2203/64* (2013.01)

(58) Field of Classification Search
CPC .. G02F 1/1334; G02F 1/1347; G02F 1/13475; G02F 1/133502; G02F 2203/64
See application file for complete search history.

(56) References Cited

U.S. PATENT DOCUMENTS

| | | | |
|---|---|---|---|
| 4,834,508 A | | 5/1989 | Fergason |
| 5,194,973 A | * | 3/1993 | Isogai ................... G02F 1/1334 349/10 |
| 5,208,686 A | | 5/1993 | Fergason |
| 5,317,431 A | | 5/1994 | Yoshida et al. |

(Continued)

FOREIGN PATENT DOCUMENTS

| | | |
|---|---|---|
| CN | 86101192 A | 9/1986 |
| CN | 101673525 A | 3/2010 |

(Continued)

*Primary Examiner* — Paisley L Arendt

(74) *Attorney, Agent, or Firm* — Birch, Stewart, Kolasch & Birch, LLP

(57) ABSTRACT

A light shielding apparatus that may transmit or shield light by using a plurality of PDLC layers, a method of fabricating the light shielding apparatus, and a transparent display device including the light shielding apparatus are discussed. The light shielding apparatus can include first and second substrates facing each other; a first electrode on the first substrate; a second electrode on the second substrate; and first and second polymer dispersed liquid crystal layers between the first electrode and the second electrode, wherein the first polymer dispersed liquid crystal layer includes first droplets having first liquid crystals, and the second polymer dispersed liquid crystal layer includes second droplets having second liquid crystals and first dichroic dyes.

15 Claims, 14 Drawing Sheets

(56) References Cited

U.S. PATENT DOCUMENTS

| | | | |
|---|---|---|---|
| 5,394,256 A * | 2/1995 | Yamada | C09K 19/02 349/166 |
| 5,508,831 A | 4/1996 | Nakamura et al. | |
| 6,219,133 B1 | 4/2001 | Kawase et al. | |
| 8,248,562 B2 * | 8/2012 | Adachi | G02B 1/111 349/137 |
| 2008/0303982 A1 | 12/2008 | Jin et al. | |
| 2010/0060825 A1 | 3/2010 | Jang et al. | |
| 2011/0261303 A1 * | 10/2011 | Jang | G02F 1/13318 349/108 |

FOREIGN PATENT DOCUMENTS

| | | |
|---|---|---|
| CN | 102914899 A | 2/2013 |
| JP | 6-202099 A | 7/1994 |

* cited by examiner

LIGHT SHIELDING APPARATUS, METHOD OF FABRICATING THE SAME, AND TRANSPARENT DISPLAY DEVICE INCLUDING THE SAME

CROSS REFERENCE TO RELATED APPLICATIONS

This application claims the priority benefit of the Korean Patent Application No. 10-2014-0065085 filed on May 29, 2014 and No. 10-2015-0060036 filed on Apr. 28, 2015, which are all hereby incorporated by reference for all purposes as if fully set forth herein.

BACKGROUND OF THE INVENTION

1. Field of the Invention

The present invention relates to a light shielding apparatus that may realize a transparent mode and a light-shielding mode, a method of fabricating the light shielding apparatus, and a transparent display device including the light shielding apparatus.

2. Discussion of the Related Art

Recently, with the advancement of the information age, display devices for processing and displaying a large amount of information have been promptly developed. More particularly, various flat panel display (FPD) devices have been introduced and spotlighted.

Detailed examples of the flat panel display devices include liquid crystal display (LCD) devices, plasma display panel (PDP) devices, field emission display (FED) devices, electroluminescence display (ELD) devices, and organic light emitting display (OLED) devices. The flat panel display devices generally have excellent properties of a thin profile, light weight and low power consumption and thus their application fields have been increased continuously. In particular, in most of electron devices or mobile devices, the flat panel display device has been used as a user interface.

Also, studies of transparent display devices through which a user may see objects or images located at an opposite side have been actively made. The transparent display devices may have advantages of better use of space, interior and design, and may have various application fields. The transparent display devices may solve spatial and temporal restrictions of the existing electronic devices by realizing functions of information recognition, information processing and information display as a transparent electronic device. Such transparent display devices may be used for a smart window, which may be used as a window of a smart home or a smart car.

Of the transparent display devices, the transparent display device based on LCD technology may be realized by applying an edge type backlight thereto. However, the transparent display device to which LCD technologies are applied has a problem in that transparency can be deteriorated by a polarizing plate used for realization of black. Also, a problem occurs in outdoor visibility of the transparent display device based on LCD technology.

The transparent display device based on OLED technology has power consumption higher than that of the LCD technology and has a difficulty in displaying a true black. Also, although the transparent display device based on OLED technology has no problem in a contrast ratio under a dark environment, a problem occurs in that a contrast ratio is deteriorated under a normal environment.

Therefore, to realize a transparent mode and a light shielding mode, an apparatus based on polymer dispersed liquid crystals (hereinafter, referred to as "PDLC") may be used as a light shielding apparatus of a transparent display device based on OLED technology. The PDLC may be formed by mixing a monomer with liquid crystals, changing the monomer to a polymer through ultraviolet (hereinafter, referred to as "UV") hardening and making the liquid crystals at a droplet state inside the polymer.

If an electric field is applied to PDLC, arrangement of the liquid crystals arranged inside the polymer is varied. Therefore, the PDLC may scatter or transmit light which is externally incident. That is, an apparatus based on the PDLC may scatter or transmit light even without a polarizing plate, the apparatus may be applied to a light shielding apparatus of a transparent display device.

SUMMARY OF THE INVENTION

The present invention is directed to a light shielding apparatus, a method of fabricating the light shielding apparatus, and a transparent display device including the light shielding apparatus, which substantially obviate one or more problems due to limitations and disadvantages of the related art.

An advantage of the embodiments of the present invention is to provide a light shielding apparatus, a method of fabricating the light shielding apparatus, and a transparent display device including the light shielding apparatus, in which a plurality of PDLC layers are provided to obtain higher light transmittance ratio in a transparent mode and higher light shielding ratio in a light shielding mode than those of a single PDLC layer.

Another advantage of the embodiments of the present invention is to provide a light shielding apparatus that may increase light transmittance ratio in a transparent mode and increase light shielding ratio in a light shielding mode by controlling a size of droplets in a plurality of PDLC layers.

Still another advantage of the embodiments of the present invention is to provide a light shielding apparatus that may reduce the amount of dichroic dyes included in a plurality of PDLC layers to increase light transmittance ratio in a transparent mode.

Further still another advantage of the embodiments of the present invention is to provide a light shielding apparatus that may display a specific color in accordance with dichroic dyes to prevent its rear background from being seen.

Further still another advantage of the embodiments of the present invention is to provide a light shielding apparatus that includes a plurality of PDLC layers to reduce the cost by simplifying a manufacturing process.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light shielding apparatus according to various embodiments of the present invention can include first and second substrates facing each other; a first electrode on the first substrate; a second electrode on the second substrate; and first and second polymer dispersed liquid crystal layers between the first electrode and the second electrode, wherein the first polymer dispersed liquid crystal layer includes first droplets having first liquid crystals, and the second polymer dispersed liquid crystal layer includes second droplets having second liquid crystals and first dichroic dyes.

In one or more embodiments, the first and second polymer dispersed liquid crystal layers are realized in a light shielding mode for shielding incident light, if no voltage is applied to each of the first and second electrodes or if a difference between a first voltage applied to the first electrode and a second voltage applied to the second electrode is smaller than a first threshold voltage.

In one or more embodiments, the first and second polymer dispersed liquid crystal layers are realized in a transparent mode for transmitting incident light, if a difference between a first voltage applied to the first electrode and a second voltage applied to the second electrode is greater than a second threshold voltage.

In one or more embodiments, the second droplets have a size greater than that of the first droplets.

In one or more embodiments, the second droplets have a size smaller than five times of that of the first droplets.

In one or more embodiments, the light shielding apparatus further comprises a third polymer dispersed liquid crystal layer between the first electrode and the second electrode.

In one or more embodiments, the third polymer dispersed liquid crystal layer includes third droplets having third liquid crystals and second dichroic dyes.

In one or more embodiments, the third droplets have a size greater than that of the first droplets.

In one or more embodiments, the third polymer dispersed liquid crystal layer includes third droplets having third liquid crystals.

In one or more embodiments, the third droplets have a size smaller than that of the second droplets.

In one or more embodiments, the light shielding apparatus further comprises: a first refractive index matching layer on an opposite surface of one surface of the first substrate having the first electrode, the first refractive index matching layer having a refractive index between a refractive index of the first substrate and a refractive index of air; and a second refractive index matching layer on an opposite surface of one surface of the second substrate having the second electrode, the second refractive index matching layer having a refractive index between a refractive index of the second substrate and a refractive index of the air.

In one or more embodiments, the light shielding apparatus further comprises: a first refractive index matching layer between the first substrate and the first electrode, the first refractive index matching layer having a refractive index between a refractive index of the first substrate and a refractive index of the first electrode; and a second refractive index matching layer between the second substrate and the second electrode, the second refractive index matching layer having a refractive index between a refractive index of the second substrate and a refractive index of the second electrode.

In one or more embodiments, the light shielding apparatus further comprises: a first refractive index matching layer between the first electrode and the first polymer dispersed liquid crystal layer, the first refractive index matching layer having a refractive index between a refractive index of the first electrode and a refractive index of the first polymer dispersed liquid crystal layer; and a second refractive index matching layer arranged between the second electrode and the second polymer dispersed liquid crystal layer, the second refractive index matching layer having a refractive index between a refractive index of the second electrode and a refractive index of the second polymer dispersed liquid crystal layer.

In one or more embodiments, the light shielding apparatus further comprises a transparent adhesive layer assembling the first and second polymer dispersed liquid crystal layers to each other.

In another aspect of the present invention, a transparent display device can include a transparent display panel including a transmissive area and a non-transmissive area, provided with pixels displaying an image in the non-transmissive area; and a light shielding apparatus on one surface of the transparent display panel, wherein the light shielding apparatus includes a plurality of liquid crystal layers, at least one of the plurality of liquid crystal layers includes first dichroic dyes, the plurality of liquid crystal layers are realized in a light shielding mode for shielding incident light if no voltage is applied, and are realized in a transparent mode for transmitting incident light if a voltage is applied, and the plurality of liquid crystal layers are realized in the light shielding mode if a display mode in which the pixels display an image is realized, and are realized in the transparent mode of the light shielding mode if a non-display mode in which the pixels do not display an image is realized.

In one or more embodiments, the plurality of liquid crystal layers include a first polymer dispersed liquid crystal layer that includes first droplets having first liquid crystals and include a second polymer dispersed liquid crystal layer that includes second droplets having second liquid crystals and the first dichroic dyes.

In still another aspect of the present invention, a method of fabricating a light shielding apparatus can include forming a first electrode on a first substrate and forming a second electrode on a second substrate; forming a first polymer dispersed liquid crystal layer by forming a first liquid crystal material on the first electrode and irradiating UV on the first liquid crystal material, the first liquid crystal material having a mixture of a first monomer and first liquid crystals; forming a second polymer dispersed liquid crystal layer by forming a second liquid crystal material on the first polymer dispersed liquid crystal layer and irradiating UV on the second liquid crystal material, the second liquid crystal material having a mixture of a second monomer and second liquid crystals, and the UV having energy smaller than that of UV irradiated when the first polymer dispersed liquid crystal layer is formed; and assembling the second polymer dispersed liquid crystal layer to the first polymer dispersed liquid crystal layer by irradiating UV onto the second polymer dispersed liquid crystal layer.

In one or more embodiments, a mixture ratio of the first monomer and the first liquid crystals in the first liquid crystal material and a mixture ratio of the second monomer and the second liquid crystals in the second liquid crystal material are within a range of 40 wt %:60 wt % to 20 wt %:80 wt %, and the first dichroic dyes in the second liquid crystal material are within a range of 0.5 wt % to 5 wt %.

In one or more embodiments, a size of droplets of the first polymer dispersed liquid crystal layer and a size of droplets of the second polymer dispersed liquid crystal layer are varied by an energy difference between UV irradiated when the first polymer dispersed liquid crystal layer is formed and UV irradiated when the second polymer dispersed liquid crystal layer is formed.

In one or more embodiments, a size of droplets of the first polymer dispersed liquid crystal layer is smaller than a size of droplets of the second polymer dispersed liquid crystal layer due to an energy difference between UV irradiated when the first polymer dispersed liquid crystal layer is formed and UV irradiated when the second polymer dispersed liquid crystal layer is formed.

In another aspect of the present invention, a display device may include: a display panel; and at least one light shielding apparatus according to one or more embodiments described herein attached to the display panel.

In one or more embodiments, the display panel is an OLED panel.

In one or more embodiments, the light shielding apparatus is attached to the front surface of the display panel.

In one or more embodiments, the light shielding apparatus is attached to the rear surface of the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
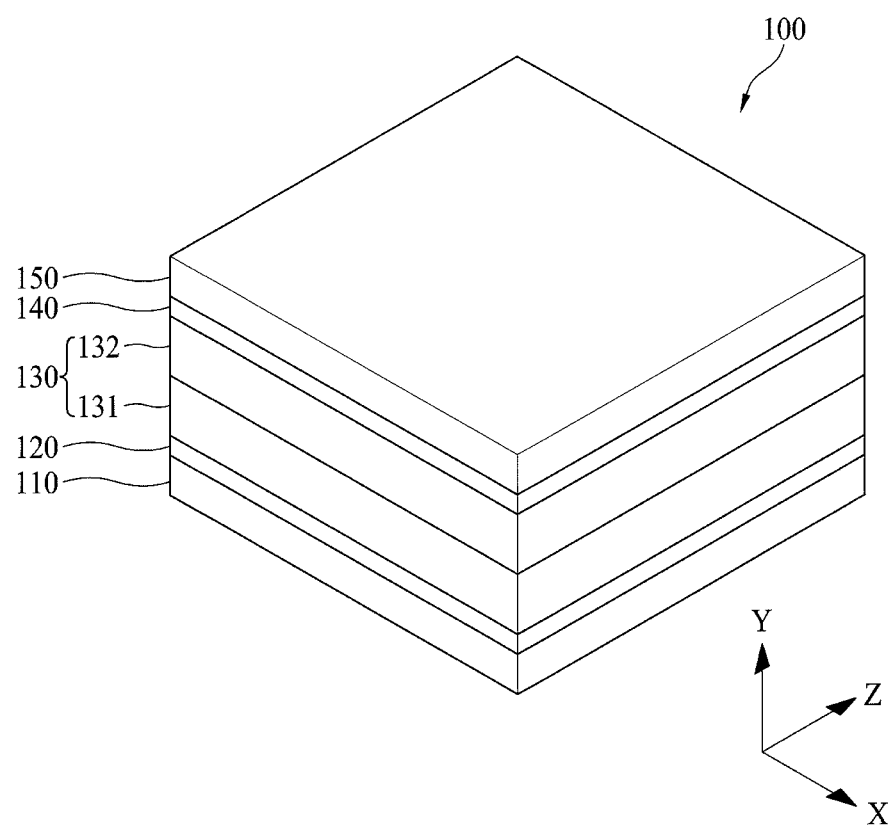
FIG. 1 is a perspective view illustrating a light shielding apparatus according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

"X-axis direction", "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the embodiments of the present invention will be described in detail with reference to the accompanying drawings.

In polymer dispersed liquid crystals (PDLC) used for a light shielding apparatus of a transparent display device, incident light is scattered by liquid crystals and polymer, which are arranged randomly at an initial state, whereby a white light shielding mode is realized, and if the liquid crystals are arranged vertically by application of a voltage, the incident light is transmitted without being scattered, whereby a transparent mode is realized.

In this respect, the inventors of the present invention have invented a light shielding apparatus of a new structure through several experiments, in which a transparent mode and a light shielding mode may be realized using polymer dispersed liquid crystals PDLC. The light shielding apparatus of a new structure will be described in the following embodiments.

[Light Shielding Apparatus]

A light shielding apparatus according to the embodiments of the present invention will be described in detail with reference to FIGS. 1 to 5, 6A, 6B, and 7A to 7D.

Figure 2:
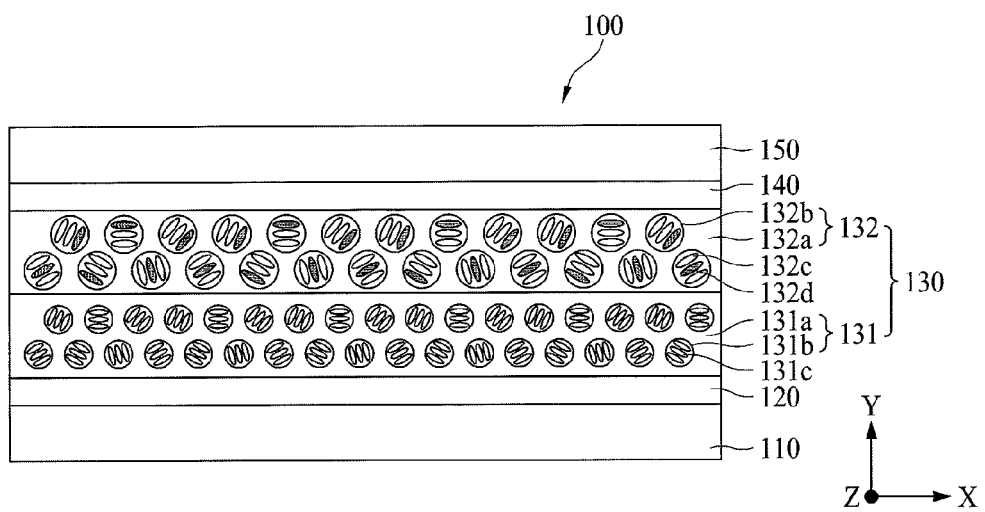
FIG. 2 is a cross-sectional view illustrating a detailed example of the light shielding apparatus of FIG. 1.

FIG. 1 is a perspective view illustrating a light shielding apparatus according to one embodiment of the present invention. FIG. 2 is a cross-sectional view illustrating a detailed example of the light shielding apparatus of FIG. 1. Referring to FIGS. 1 and 2, a light shielding apparatus 100 according to one embodiment of the present invention includes a first substrate 110, a first electrode 120, a plurality of liquid crystal layers 130, a second electrode 140, and a second substrate 150. All the components of the light shielding apparatus in this and other embodiments are operatively coupled and configured.

Each of the first substrate 110 and the second substrate 150 may be a transparent glass substrate or a plastic film. For example, each of the first substrate 110 and the second substrate 150 may be, but not limited to, a sheet or film that includes cellulose resin such as TAC(triacetyl cellulose) or DAC(diacetyl cellulose), COP(cyclic olefin polymer) such as Norbornene derivatives, COC (cyclic olefin copolymer), acryl resin such as PMMA(poly(methylmethacrylate)), polyolefin such as PC(polycarbonate), PE(polyethylene) or PP(polypropylene), polyester such as PVA(polyvinyl alcohol), PES(poly ether sulfone), PEEK(polyetheretherketone), PEI(polyetherimide), PEN(polyethylenenaphthalate), and PET(polyethyleneterephthalate), PI(polyimide), PSF(polysulfone), or fluoride resin.

The first electrode 120 is provided on the first substrate 110, and the second electrode 140 is provided on the second substrate 150. Each of the first and second electrodes 120 and 140 may be a transparent electrode. For example, each of the first and second electrodes 120 and 140 may be, but not limited to, silver oxide (AgO or $Ag_2O$ or $Ag_2O_3$), aluminum oxide (e.g.; $Al_2O_3$), tungsten oxide (e.g.; $WO_2$ or $WO_3$ or $W_2O_3$), magnesium oxide (e.g.; MgO), molybdenum (e.g.; $MoO_3$), zinc oxide (e.g.; ZnO), tin oxide (e.g.; $SnO_2$), indium oxide (e.g.; $In_2O_3$), chrome oxide (e.g.; $CrO_3$ or $Cr_2O_3$), antimony oxide (e.g.; $Sb_2O_3$ or $Sb_2O_5$), titanium oxide (e.g; $TiO_2$), nickel oxide (e.g.; NiO), copper oxide (e.g; CuO or $Cu_2O$), vanadium oxide (e.g.; $V_2O_3$ or $V_2O_5$), cobalt oxide (e.g.; CoO), iron oxide (e.g.; $Fe_2O_3$ or $Fe_3O_4$) niobium oxide (e.g.; $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

Although the transparent mode and the light shielding mode may be realized by a PDLC layer comprised of a single layer, a white light shielding mode is represented by light scattering in the light shielding mode. However, the inventors of the present application have recognized that a light shielding mode of black not the light shielding mode of white should be realized for a light shielding apparatus for a transparent display device in view of visibility or a contrast ratio.

Therefore, the inventors of the present application have carried out various experiments to improve a light shielding state of PDLC. Also, the inventors of the present application have tested PDLC, which include dyes, to realize a light shielding mode of black, and have identified that the light shielding mode of black may be realized by light absorption of the dyes. However, if the transparent mode is realized, the present inventors have identified that transmittance is deteriorated due to light absorption of the dyes as compared with the PDLC which does not include dyes. Also, in order to improve transmittance of the transparent mode, a droplet size of the PDLC may be increase to reduce dyes of a droplet surface or dyes of outside of the droplets. However, the present inventors have recognized that there is a difficulty in realizing the light shielding mode because light scattering is increased if the size of the droplets becomes greater.

In this respect, the inventors of the present application have recognized the aforementioned problems and have invented a light shielding apparatus of a new structure, which may minimize light absorption of dyes in a transparent mode and realize a light shielding mode of black in a light shielding mode.

As shown in FIG. 1, the plurality of liquid crystal layers 130 provided between the first substrate 110 and the second substrate 150 may include a first polymer dispersed liquid crystal layer 131 (hereinafter, referred to as "PDLC layer") and a second PDLC layer 132. Although FIG. 1 illustrates that the plurality of liquid crystal layers 130 include only first and second PDLC layers 131 and 132, the plurality of liquid crystal layers 130 may include three or more PDLC layers without limitation to the example of FIG. 1.

The first PDLC layer 131 includes a first polymer 131a and first droplets 131b. A plurality of first liquid crystals 131c may be included in each of the first droplets 131b. That is, the first liquid crystals 131c may be dispersed into the plurality of first droplets 131b by the first polymer 131a. The first liquid crystals 131c may be, but not limited to, nematic liquid crystals of which arrangement is varied by a vertical (y-axis directional) electric field of the first and second electrodes 120 and 140. The second PDLC layer 132 is provided on the first PDLC layer 131. The second PDLC layer 132 includes a second polymer 132a and second droplets 132b. The second PDLC layer 132 will be described with reference to FIG. 2.

As shown in FIG. 2, to realize a light shielding mode of black, each of the second droplets 132b of the second PDLC layer 132 includes a plurality of second liquid crystals 132c and first dichroic dyes 132d. If the second droplets 132b do not include the first dichroic dyes 132d, light incident upon the second PDLC layer 132 is only scattered, whereby a light shielding mode of white is realized. If the light shielding apparatus according to the embodiment of the present invention is applied to the transparent display device and the transparent display device displays an image, it is more preferable that a light shielding mode of black is realized to improve image quality of the transparent display device than a light shielding mode of white. Therefore, if the light shielding apparatus according to the embodiment of the present invention is applied to the transparent display device, it is preferable that the second droplets 132b include the first dichroic dyes 132d to improve light shielding efficiency and image quality of the transparent display device.

The plurality of liquid crystals 132c and the first dichroic dyes 132d may be dispersed into the plurality of second droplets 132b by the second polymer 132a. A black state of the light shielding mode may be realized by light absorption of the first dichroic dyes 132d. That is, external light passes through the first PDLC layer 131, whereby light is scattered, and a light shielding mode is realized by scattering of the second PDLC layer 132 and light absorption of the first dichroic dyes 132d. Also, since the light scattered by passing through the first PDLC layer 131 passes through the second PDLC layer 132 with a long light path, light shielding efficiency may be increased.

The second liquid crystals 131c may be, but not limited to, nematic liquid crystals arranged by the vertical electric field of the first and second electrodes 120 and 140. Arrangement of the first dichroic dyes 132d may be varied by the vertical electric field of the first and second electrodes 120 and 140 in the same manner as the second liquid crystals 132c.

The first dichroic dyes 132d may be dyes that absorb light. For example, the first dichroic dyes 132d may be black dyes that absorb every light of a visible ray wavelength range or dyes that absorb light except a specific colored (for example, red color) wavelength and reflect light of the specific colored (for example, red color) wavelength. In the embodiment of the present invention, the first dichroic dyes 132d may be, but not limited to, black dyes to increase light shielding efficiency. Also, the first PDLC layer 131 may also include dichroic dyes. In this case, it is preferable that the amount of the dichroic dyes is included in the first PDLC layer 131 in the range that transmittance of light that has passed through the first PDLC layer 131 in the transparent mode is not deteriorated.

Figure 3:
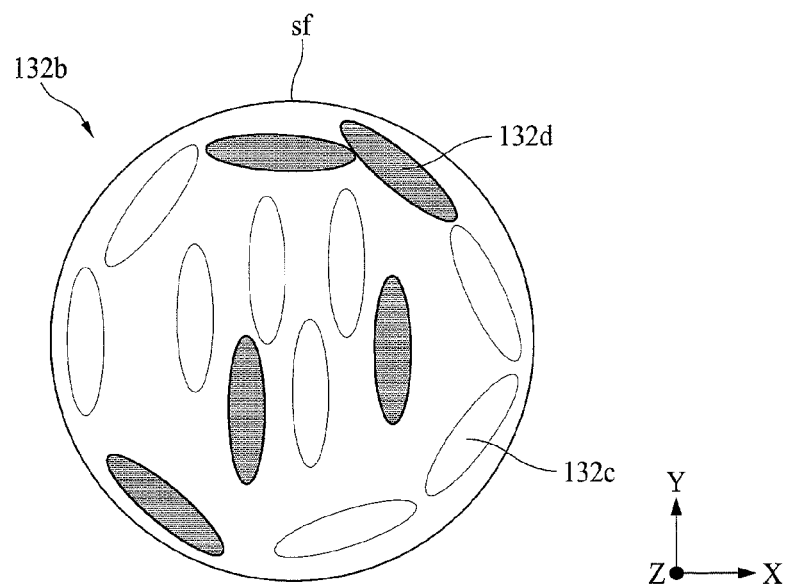
FIG. 3 is an exemplary view illustrating a second droplet of a second PDLC layer.

FIG. 3 is an exemplary view illustrating second droplets of a second PDLC layer according to an embodiment of the present invention.

As shown in FIG. 3, the second droplets 132b correspond to a liquid state internally, and correspond to a solid state externally due to the second polymer 132a. Since the first dichroic dyes 132d on a surface sf of the second droplets 132b may be stuck to the second polymer 132a, their arrangement may not be varied by the vertical electric field of the first and second electrodes 120 and 140. If the size of the second droplets 132b becomes smaller, the first dichroic dyes 132d stuck to the second polymer 132a on the surface sf of the second droplets 132b may be increased. Since arrangement of the first dichroic dyes 132d stuck as above is not varied by the vertical electric field, the first dichroic dyes 132d which are not stuck to the second polymer 132a are arranged in a vertical direction (y-axis direction), whereas the first dichroic dyes 132d stuck to the second polymer 132a may be arranged in a horizontal direction (x-axis direction). Therefore, the inventors of the present application have recognized a problem that transmittance of light that passes through the plurality of liquid crystal layers 130 in the transparent mode is deteriorated. Also, the size of the droplets may be increased to reduce the first dichroic dyes 132d on the surface sf of the droplets, whereby transmittance of the transparent mode may be improved. However, if the size of the droplets becomes greater, scattering of light is increased, whereby it is difficult to realize the light shielding mode. Therefore, it is preferable that the size of the second droplets 132b of the second PDLC layer 132 may be greater than the size of the first droplets 131b of the first PDLC layer 131 to reduce a surface area of the second droplets 132b, whereby the amount of the first dichroic dyes 132d stuck to the second polymer 132a is reduced. However, if the size of the second droplets 132b becomes too greater, a problem may occur in that light shielding efficiency of light that passes through the plurality of liquid crystal layers 130 is reduced in the light shielding mode. Therefore, it is preferable that the size of the second droplets 132b does not exceed five times of the size of the first droplets 131b.

Also, the first and second PDLC layers 131 and 132 exist at a solid state for the other portions except the droplets 131b and 132b due to the polymers 131a and 131b. Therefore, each of the first and second PDLC layers 131 and 132 may maintain a cell gap between the first substrate 110 and the second substrate 150 even without spacers or walls. As a result, in the embodiment of the present invention, a fabricating process may be simplified, and a fabricating cost may be reduced.

The light shielding apparatus 100 according to the embodiment(s) of the present invention may be realized in a light shielding mode shielding light and a transparent mode transmitting light by controlling voltages applied to the first and second electrodes 120 and 140. Hereinafter, the transparent mode and the light shielding mode of the light shielding apparatus 100 will be described in detail with reference to FIGS. 4 and 5.

Figure 4:
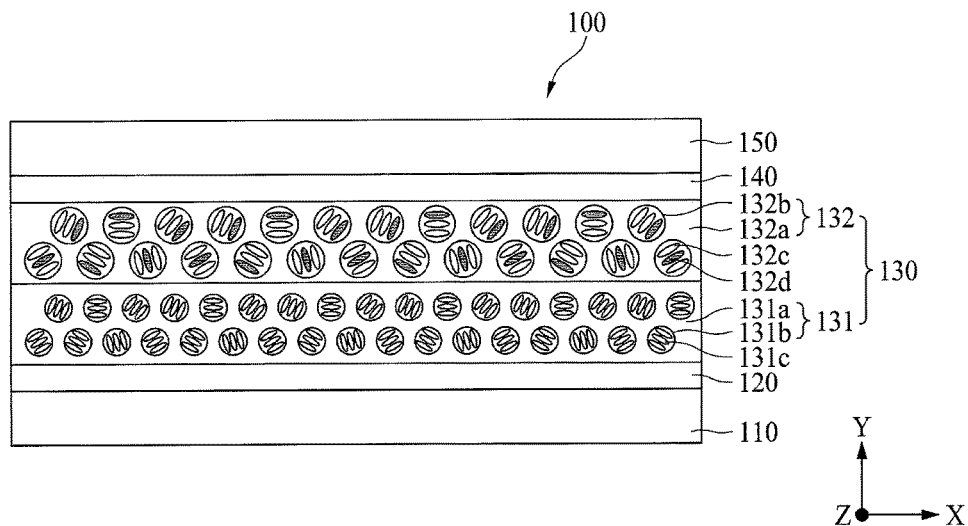
FIG. 4 is a cross-sectional view illustrating an example of a light shielding apparatus of a light shielding mode.
Figure 5:
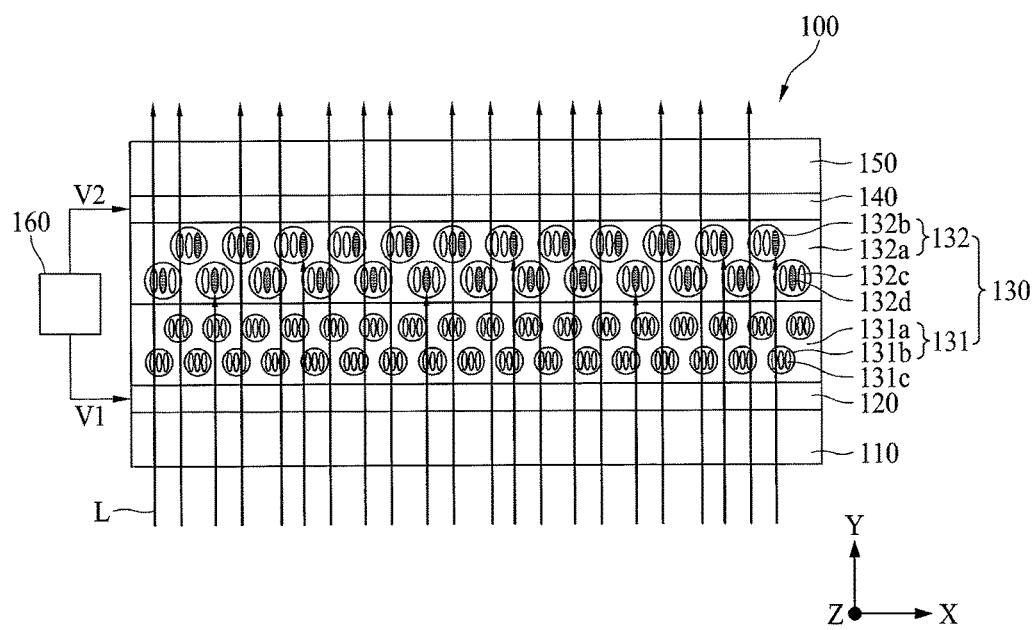
FIG. 5 is a cross-sectional view illustrating an example of a light shielding apparatus of a transparent mode.

FIG. 4 is a cross-sectional view illustrating an example of a light shielding apparatus of a light shielding mode according to an embodiment of the present invention, and FIG. 5 is a cross-sectional view illustrating an example of a light shielding apparatus of a transparent mode according to an embodiment of the present invention.

As shown in FIGS. 4 and 5, the light shielding apparatus 100 may further include a voltage supply unit 160 for supplying a predetermined voltage to each of the first and second electrodes 120 and 140. The light shielding apparatus 100 may be realized in a light shielding mode shielding incident light and a transparent mode transmitting incident light by controlling liquid crystals and dichroic dyes of the plurality of liquid crystal layers 130 in accordance with voltages applied to the first and second electrodes 120 and 140.

As shown in FIG. 4, if no voltage is applied to the first and second electrodes 120 and 140 or a voltage difference between a first voltage applied to the first electrode 120 and a second voltage applied to the second electrode 140 is smaller than a first threshold voltage, the first liquid crystals 131c of the first PDLC layer 131 and the second liquid crystals 132c and the first dichroic dyes 132d of the second PDLC layer 132 are randomly arranged.

At this time, the light incident upon the first PDLC layer 131 is scattered by the first liquid crystals 131c. The light scattered by the first liquid crystals 131c is scattered by the second liquid crystals 132c of the second PDLC layer 132 or absorbed by the first dichroic dyes 132d. Therefore, the light shielding apparatus may shield the incident light in the light shielding mode. For example, the light shielding apparatus may shield the incident light by displaying a black based color in the light shielding mode if the first dichroic dyes 132d are black dyes. That is, in the embodiment of the present invention, the light shielding apparatus 100 may allow its rear background not to be displayed by displaying a specific color in accordance with the first dichroic dyes 132d.

Particularly, the light incident upon the first PDLC layer 131 is scattered by the first liquid crystals 131c. Therefore, the scattered light has a long path. The scattered light of which path becomes long is incident upon the second PDLC layer 132. The scattered light incident upon the second PDLC layer 132 may be scattered by the second liquid crystals 132c or absorbed by the first dichroic dyes 132d. Therefore, if the light shielding apparatus 100 includes the plurality of PDLC layers 131 and 132 in the same manner as the embodiment of the present invention, light shielding efficiency may be more improved than efficiency of light shielding performed using one PDLC layer. This will be described later with reference to FIG. 7.

FIG. 5 is a cross-sectional view illustrating an example of a light shielding apparatus of a transparent mode according to an embodiment of the present invention.

As shown in FIG. 5, if the voltage difference between the first voltage applied to the first electrode 120 and the second voltage applied to the second electrode 140 is smaller than a second threshold voltage, the first liquid crystals 131c of the first PDLC layer 131 and the second liquid crystals 132c and the first dichroic dyes 132d of the second PDLC layer 132 are arranged in a vertical direction (y-axis direction) by the vertical electric field formed between the first electrode 120 and the second electrode 140. At this time, the second threshold voltage may be greater than or the same as the first threshold voltage.

At this time, the first liquid crystals 131c are arranged in an incident direction of the light, and a refractive index between the first polymer 131a and the first liquid crystals 131c of the first PDLC layer 131 is minimized, whereby scattering of the light incident upon the first PDLC layer 131 is minimized. Also, the second liquid crystals 132c and the first dichroic dyes 132d are also arranged in an incident direction of the light, and a refractive index between the second polymer 132a and the second liquid crystals 132c of the second PDLC layer 132 is minimized, whereby scattering and absorption of the light incident upon the second PDLC layer 132 are minimized. Therefore, most of the light incident upon the light shielding apparatus 100 may pass through the plurality of liquid crystal layers 130.

As described with reference to FIGS. 4 and 5, in the embodiment(s) of the present invention, the first PDLC Layer 131 that includes the first liquid crystals 131c may transmit the light in the transparent mode and shield the light in the light shielding mode. The second PDLC layer 132 that includes the second liquid crystals 132c and the first dichroic dyes 132d may transmit the light in the transparent mode and scatter and absorb in the light in the light shielding mode. Therefore, the light shielding apparatus 100 may transmit the light in the transparent mode and shield the light in the light shielding mode.

Meanwhile, if the light shielding apparatus 100 includes one PDLC layer that includes dichroic dyes, many dichroic dyes should be included in one PDLC layer to absorb the light. In this case, a problem occurs in that transmittance of the light shielding apparatus 100 is reduced in the transparent mode.

As described with reference to FIGS. 1 to 4, the light shielding apparatus 100 according to the embodiment(s) of the present invention includes a plurality of PDLC layers 131 and 132. In this case, the light incident upon the first PDLC layer 131 is scattered by the first liquid crystals 131c. Therefore, the scattered light has a long path. The scattered light of which path becomes long is incident upon the second PDLC layer 132. The scattered light incident upon the second PDLC layer 132 may be scattered by the second liquid crystals 132c of the second PDLC layer 132 or absorbed by the first dichroic dyes 132d. That is, if the light shielding apparatus 100 includes the plurality of PDLC layers 131 and 132 in the same manner as the embodiment of the present invention, the incident light is scattered and absorbed by the plurality of PDLC layers. Therefore, if the light shielding apparatus includes the plurality of PDLC layers 131 and 132 not one PDLC layer 130, the amount of the dichroic dyes may be reduced relatively. Therefore, absorption of the light by the dichroic dyes in the transparent mode may be minimized, whereby transmittance of the light may be increased.

Figure 6A:
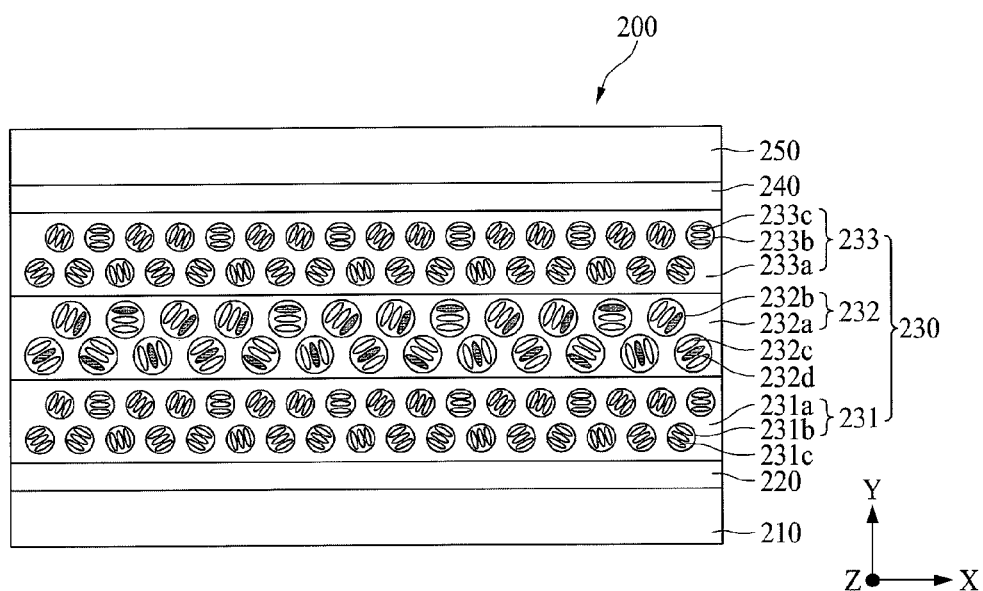
FIGS. 6A and 6B are cross-sectional views illustrating another detailed examples of the light shielding apparatus of FIG. 1.

FIG. 6A is a cross-sectional view illustrating another detailed example of the light shielding apparatus of FIG. 1.

As shown in FIG. 6A, a light shielding apparatus 200 according to another embodiment of the present invention includes a first substrate 210, a first electrode 220, a plurality of liquid crystal layers 230, a second electrode 240, and a second substrate 250.

The first substrate 210, the first electrode 220, the second electrode 240, and the second substrate 250 of FIG. 6A are substantially same as the first substrate 110, the first electrode 120, the second electrode 140, and the second substrate 150, which are described with reference to FIGS. 1 and 2. Therefore, a detailed description of the first substrate 210, the first electrode 220, the second electrode 240, and the second substrate 250 of FIG. 6A will be omitted.

The plurality of liquid crystal layers 230 include first to third PDLC layers 231, 232 and 233 as shown in FIG. 6A. The first and second PDLC layers 231 and 232 of FIG. 6A are substantially same as the first and second PDLC layers 131 and 132 described with reference to FIGS. 1 and 2. Therefore, a detailed description of the first and second PDLC layers 231 and 232 of FIG. 6A will be omitted.

The third PDLC layer 233 is provided on the second PDLC layer 232. The third PDLC layer 233 includes a second polymer 233a and third droplets 233b. A plurality of third liquid crystals 233c may be included in each of the third droplets 233b. That is, the third liquid crystals 233c may be dispersed into the plurality of third droplets 233b by the third polymer 233a. The third liquid crystals 233c may be, but not limited to, nematic liquid crystals of which arrangement is varied by the vertical (y-axis directional) electric field of the first and second electrodes 220 and 240. Although the third PDLC layer 233 may include dichroic dyes, it is preferable that the amount of the dichroic dyes included in the third PDLC layer 233 does not reduce transmittance of the light that has passed through the first PDLC layer 231 in the transparent mode.

The third PDLC layer 233 may scatter the light that has passed through the second PDLC layer 232 without being absorbed fey the dichroic dyes 232d of the second PDLC layer 232. Therefore, in the embodiment of the present invention, light shielding efficiency in the light shielding mode may be more increased.

Meanwhile, the first dichroic dyes 232d arranged on a surface of the second droplets 232b may be stuck to the second polymer 232a. Therefore, arrangement of the first dichroic dyes 232d may not be varied by the vertical electric field of the first and second electrodes 220 and 240. If the size of the second droplets 232b becomes smaller, the first dichroic dyes 232d stuck to the second polymer 232a on the surface of the second droplets 232b may be increased. Since arrangement of the first dichroic dyes 232d stuck as above is not varied by the electric field, a problem occurs in that transmittance of the light that passes through the plurality of liquid crystal layers 230 in the transparent mode is reduced. Therefore, it is preferable that the size of the second droplets 232b of the second PDLC layer 232 may be greater than the size of the first droplets 231b of the first PDLC layer 231 or the size of the third droplets 233b of the third PDLC layer 233 to reduce a surface area of the second droplets 232b, whereby the amount of the first dichroic dyes 232d stuck to the second polymer 232a is reduced. However, if the size of the second droplets 232b becomes too greater, a problem may occur in that light shielding efficiency of light that passes through the plurality of liquid crystal layers 230 is reduced in the light shielding mode. Therefore, it is preferable that the size of the second droplets 232b does not exceed five times of the size of the first droplets 231b or the size of the third droplets 233b.

Figure 6B:
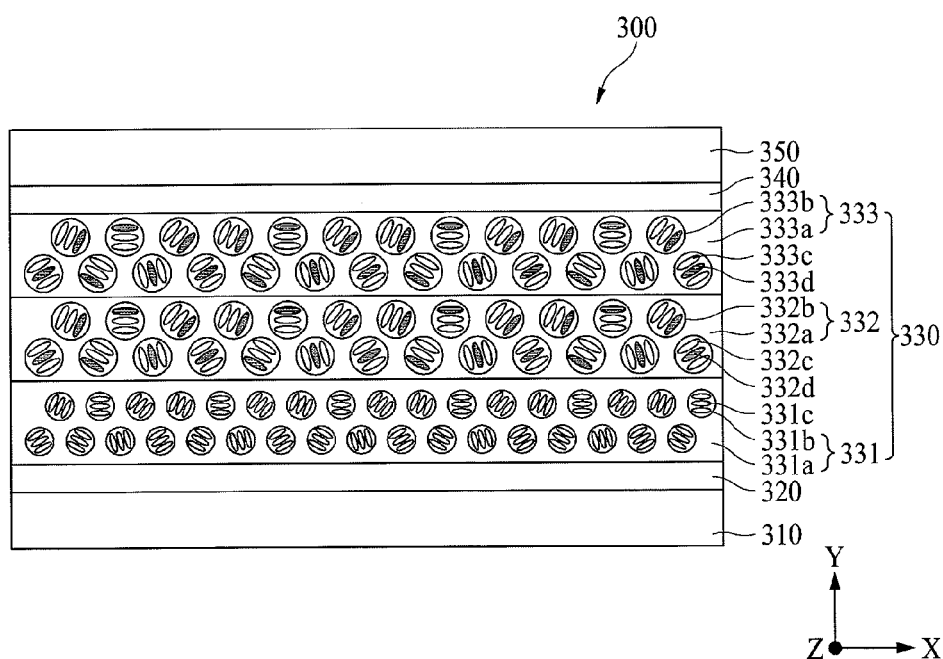

FIG. 6B is a cross-sectional view illustrating another detailed example of a light shielding apparatus of FIG. 1. As shown in FIG. 6B, a light shielding apparatus 300 according to another embodiment of the present invention includes a first substrate 310, a first electrode 320, a plurality of liquid crystal layers 330, a second electrode 340, and a second substrate 350.

The first substrate 310, the first electrode 320, the second electrode 340, and the second substrate 350 of FIG. 6B are substantially same as the first substrate 110, the first electrode 120, the second electrode 140, and the second substrate 150, which are described with reference to FIGS. 1 and 2. Therefore, a detailed description of the first substrate 310, the first electrode 320, the second electrode 340, and the second substrate 350 of FIG. 6B will be omitted.

The plurality of liquid crystal layers 330 include first to third PDLC layers 331, 332 and 333 as shown in FIG. 6B. The first and second PDLC layers 331 and 332 of FIG. 6B are substantially same as the first and second PDLC layers 131 and 132 described with reference to FIGS. 1 and 2. Therefore, a detailed description of the first and second PDLC layers 331 and 332 of FIG. 6B will be omitted.

The third PDLC layer 333 is provided on the second PDLC layer 332. The third PDLC layer 333 includes a second polymer 333a and third droplets 333a. A plurality of third liquid crystals 333c and second dichroic dyes 333d may be included in each of the third droplets 333b. That is, the third liquid crystals 333c and the second dichroic dyes 333d may be dispersed into the plurality of third droplets 333b by the third polymer 333a. The third liquid crystals 333c may be, bat not limited to, nematic liquid crystals arranged by the vertical (y-axis directional) electric field of the first and second electrodes 120 and 140. Since the second dichroic dyes 333d are substantially same as the first dichroic dyes 131d, their detailed description will be omitted.

The third PDLC layer 333 may absorb the light that has passed through the second PDLC layer 332 without being absorbed by the dichroic dyes 332d of the second PDLC layer 332. Therefore, in the embodiment of the present invention, light shielding efficiency in the light shielding mode may be more increased.

Meanwhile, the second dichroic dyes 333d arranged on a surface of the third droplets 333b may be stuck to the second polymer 333a. Therefore, arrangement of the second dichroic dyes 333d may not be varied by the vertical electric field of the first and second electrodes 320 and 340. If the size of the third droplets 333b becomes smaller, the second dichroic dyes 333d stack to the third polymer 333a on the surface of the third droplets 333b may be increased. Therefore, as arrangement of the second dichroic dyes 333d stuck as above is not varied by the electric field, a problem occurs in that transmittance of the light that passes through the plurality of liquid crystal layers 330 in the transparent mode is reduced. Therefore, it is preferable that the size of the third droplets 333b of the third PDLC layer 333 may be greater than the size of the first droplets 331b of the first PDLC layer 231 to reduce a surface area of the third droplets 333b, whereby the amount of the second dichroic dyes 333d stuck to the second polymer 333a is reduced. However, if the size of the third droplets 333b becomes too greater, a problem may occur in that light shielding efficiency of light that passes through the plurality of liquid crystal layers 330 is reduced in the light shielding mode. Therefore, it is preferable that the size of the third droplets 333b does not exceed five times of the size of the first droplets 331b.

Although the plurality of liquid crystal layers include first to third PDLC layers only in FIGS. 6A and 6B, the plurality of liquid crystal layers may include four or more PDLC layers without limitation to the examples of FIGS. 6A and 6B.

Figure 7A:
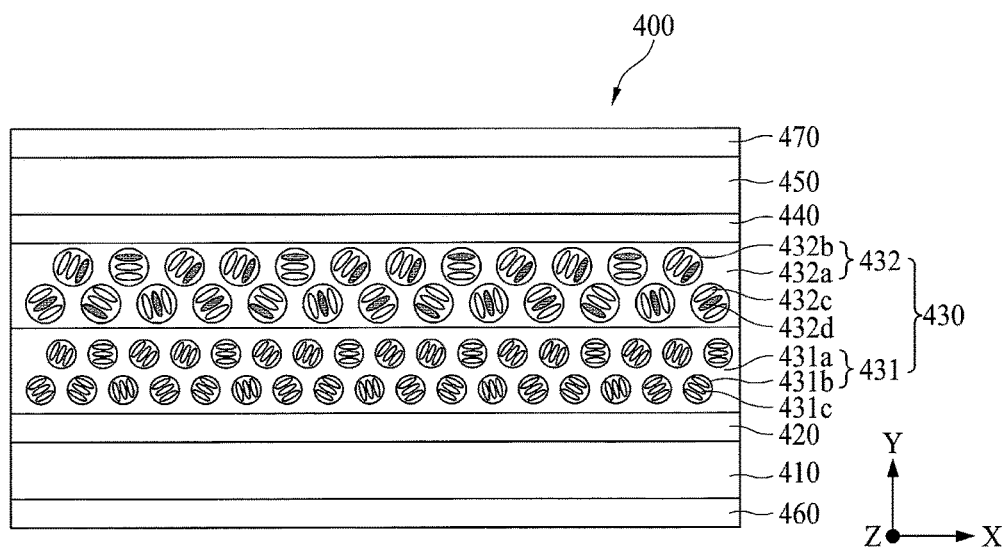
FIGS. 7A to 7D are cross-sectional views illustrating still another detailed examples of the light shielding apparatus of FIG. 1.

FIG. 7A is a cross-sectional view illustrating still another detailed example of the light shielding apparatus of FIG. 1. As shown in FIG. 7A, a light shielding apparatus 400 according to still another embodiment of the present invention includes a first substrate 410, a first electrode 420, a plurality of liquid crystal layers 430, a second electrode 440, a second substrate 450, a first refractive index matching layer 460, and a second refractive index matching layer 470.

The first substrate 410, the first electrode 420, the plurality of liquid crystal layers 430, the second electrode 440 and the second substrate 450 of FIG. 7A are substantially same as the first substrate 110, the first electrode 120, the plurality of liquid crystal layers 130, the second electrode 140, and the second substrate 150, which are described with reference to FIGS. 1 and 2. Therefore, a detailed description of the first substrate 410, the first electrode 420, the plurality of liquid crystal layers 430, the second electrode 440 and the second substrate 450 of FIG. 7A will be omitted.

The first refractive index matching layer 460 may be provided on an opposite surface of one surface of the first substrate 410, on which the first electrode 420 is provided. That is, the first electrode 420 may be provided on one surface of the first substrate 410, and the first refractive index matching layer 460 may be provided on the other surface corresponding to the opposite surface of the one surface of the first substrate 410.

Fresnel reflection may be generated due to a difference in a refractive index between the air and the first substrate 410. For example, if there is a difference in a refractive index between the air and the first substrate 410, the light entering the first substrate 410 through the air may be reflected due to the difference in a refractive index between the air and the first substrate 410. Therefore, the first refractive index matching layer 460 may have a refractive index between the air and the first substrate 410 to reduce the difference in a refractive index between the air and the first substrate 410. For example, if the refractive index of the air is 1 and the refractive index of the first substrate 410 is 1.6, the first refractive index matching layer 460 may have a refractive index between 1.1 and 1.5 to reduce the difference in a refractive index between the air and the first substrate 410.

The second refractive index matching layer 470 may be provided on an opposite surface of one surface of the second substrate 450, on which the second electrode 440 is provided. That is, the second electrode 440 may be provided on one surface of the second substrate 450, and the second refractive index matching layer 470 may be provided on the other surface corresponding to the opposite surface of the one surface of the second substrate 450.

Fresnel reflection may be generated due to a difference in a refractive index between the air and the second substrate 450. For example, if there is a difference in a refractive index between the air and the second substrate 450, the light that has passed through the second substrate 450 may partially be reflected due to the difference in a refractive index between the air and the second substrate 450 when entering the air. Therefore, the second refractive index matching layer 470 may have a refractive index between the air and the second substrate 450 to reduce the difference in a refractive index between the air and the second substrate 450. For example, if the refractive index of the air is 1 and the refractive index of the second substrate 450 is 1.6, the second refractive index matching layer 470 may have a refractive index between 1.1 and 1.5 to reduce the difference in a refractive index between the air and the second substrate 450.

Each of the first and second refractive index matching layers 460 and 470 may be made of a transparent adhesive film such as an optically clear adhesive (OCA), an organic compound adhesive that enables thermal hardening or UV hardening, etc.

Figure 7B:
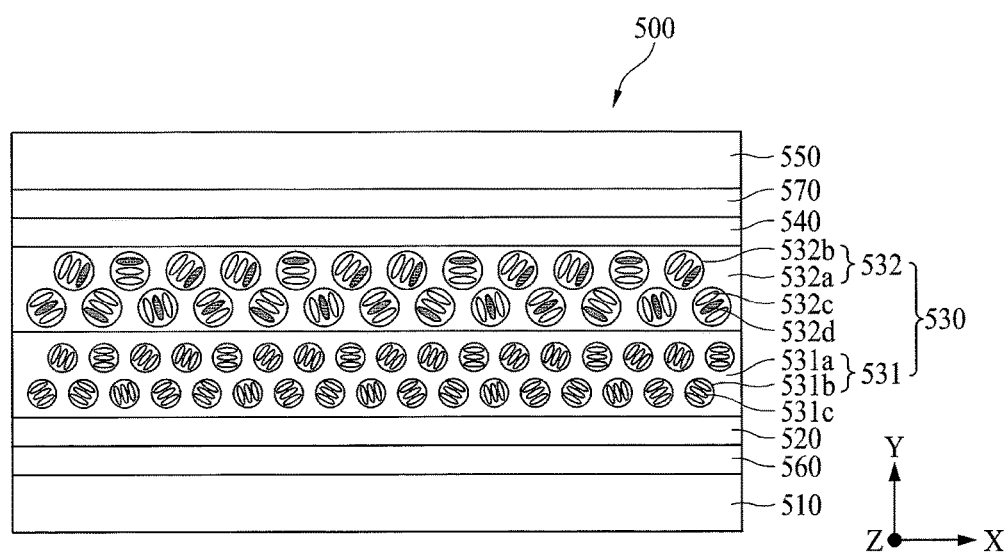

FIG. 7B is a cross-sectional view illustrating still another detailed example of the light shielding apparatus of FIG. 1. As shown in FIG. 7B, a light shielding apparatus 500 according to still another embodiment of the present invention includes a first substrate 510, a first electrode 520, a plurality of liquid crystal layers 530, a second electrode 540, a second substrate 550, a first refractive index matching layer 560, and a second refractive index matching layer 570.

The first substrate 510, the first electrode 520, the plurality of liquid crystal layers 530, the second electrode 540 and the second substrate 550 of FIG. 7B are substantially same as the first substrate 110, the first electrode 120, the plurality of liquid crystal layers 130, the second electrode 140, and the second substrate 150, which are described with reference to FIGS. 1 and 2. Therefore, a detailed description of the first substrate 510, the first electrode 520, the plurality of liquid crystal layers 530, the second electrode 540 and the second substrate 550 of FIG. 7B will be omitted.

The first refractive index matching layer 560 may be provided between the first substrate 510 and the first electrode 520. Fresnel reflection may be generated due to a difference in a refractive index between the first substrate 510 and the first electrode 520. For example, if there is a difference in a refractive index between the first substrate 510 and the first electrode 520, the light that has passed through the first substrate 510 may partially be rejected due to the difference in a refractive index between the first substrate 510 and the first electrode 520 when entering the first electrode 520. Therefore, the first refractive index matching layer 560 may have a refractive index between the first substrate 510 and the first electrode 520 to reduce the difference in a refractive index between the first substrate 510 and the first electrode 520. For example, if the refractive index of the first substrate 510 is 1.6 and the refractive index of the first electrode 520 is 2, the first refractive index matching layer 560 may have a refractive index between 1.7 and 1.9 to reduce the difference in a refractive index between the first substrate 510 and the first electrode 520.

The second refractive index matching layer 570 may be provided between the second substrate 550 and the second electrode 540. Fresnel reflection may be generated due to a difference in a refractive index between the second substrate 550 and the second electrode 540. For example, if there is a difference in a refractive index between the second substrate 550 and the second electrode 540, the light that has passed through the second electrode 540 may partially be reflected due to the difference in a refractive index between the second substrate 550 and the second electrode 540 when entering the second substrate 550. Therefore, the second refractive index matching layer 570 may have a refractive index between the second substrate 550 and the second electrode 540 to reduce the difference in a refractive index between the second substrate 550 and the second electrode 540. For example, if the refractive index of the second substrate 550 is 1.6 and the refractive index of the second electrode 540 is 2, the second refractive index matching layer 570 may have a refractive index between 1.7 and 1.9 to reduce the difference in a refractive index between the second substrate 550 and the second electrode 540.

Each of the first and second refractive index matching layers 560 and 570 may be made of a transparent adhesive film such as an optically clear adhesive (OCA), an organic compound adhesive that enables thermal hardening or UV hardening, etc.

Figure 7C:
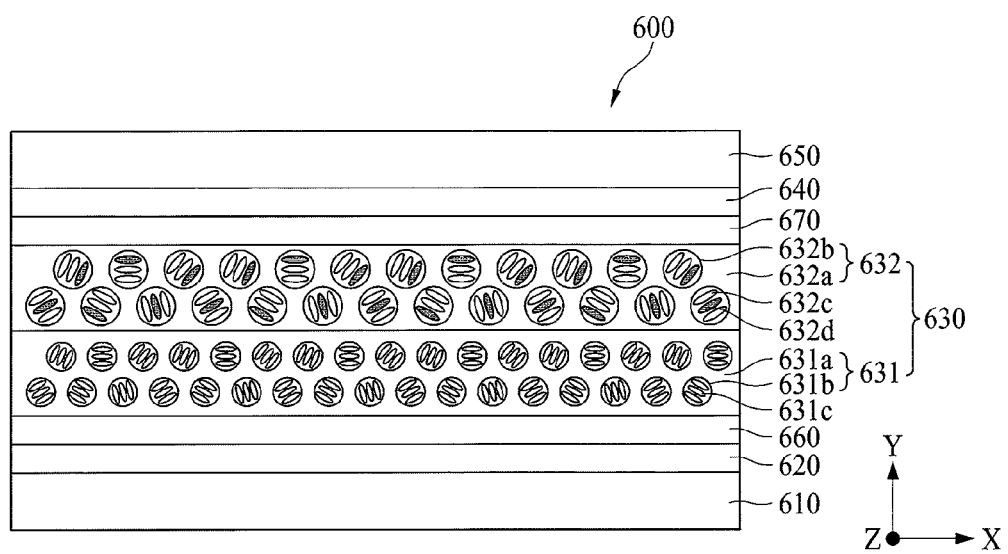

FIG. 7C is a cross-sectional view illustrating still another detailed example of the light shielding apparatus of FIG. 1. As shown in FIG. 7C, a light shielding apparatus 600 according to still another embodiment of the present invention includes a first substrate 610, a first electrode 620, a plurality of liquid crystal layers 630, a second electrode 640, a second substrate 650, a first refractive index matching layer 660, and a second refractive index matching layer 670.

The first substrate 610, the first electrode 620, the plurality of liquid crystal layers 630, the second electrode 640 and the second substrate 650 of FIG. 7C are substantially same as the first substrate 110, the first electrode 120, the plurality of liquid crystal layers 130, the second electrode 140, and the second substrate 150, which are described with reference to FIGS. 1 and 2. Therefore, a detailed description of the first substrate 610, the first electrode 620, the plurality of liquid crystal layers 630, the second electrode 640 and the second substrate 650 of FIG. 7C will be omitted.

The first refractive index matching layer 660 may be provided between the first electrode 620 and a first PDLC 631. Fresnel reflection may be generated due to a difference in a refractive index between the first electrode 620 and the first PDLC layer 631. For example, if there is a difference in a refractive index between the first electrode 620 and the first PDLC layer 631, the light that has passed through the first electrode 620 may partially be reflected due to the difference in a refractive index between the first electrode 620 and the first PDLC layer 631 when entering the first PDLC layer 631. Therefore, the first refractive index matching layer 660 may have a refractive index between the first electrode 620 and the first PDLC layer 631 to reduce the difference in a refractive index between the first electrode 620 and the first PDLC layer 631.

The second refractive index matching layer 670 may be provided between the second electrode 640 and a second PDLC layer 632. Fresnel reflection may be generated due to a difference in a refractive index between the second electrode 640 and the second PDLC layer 632. For example, if there is a difference in a refractive index between the second electrode 640 and the second PDLC layer 632, the light that has passed through the second electrode 640 may partially be reflected due to the difference in a refractive index between the second electrode 640 and the second PDLC layer 632 when entering the second PDLC layer 632. Therefore, the second refractive index matching layer 670 may have a refractive index between the second electrode 640 and the second PDLC layer 632 to reduce the difference in a refractive index between the second electrode 640 and the second PDLC layer 632.

Each of the first and second refractive index matching layers 660 and 670 may be made of a transparent adhesive film such as an optically clear adhesive (OCA), an organic compound adhesive that enables thermal hardening or UV hardening, etc.

Figure 7D:
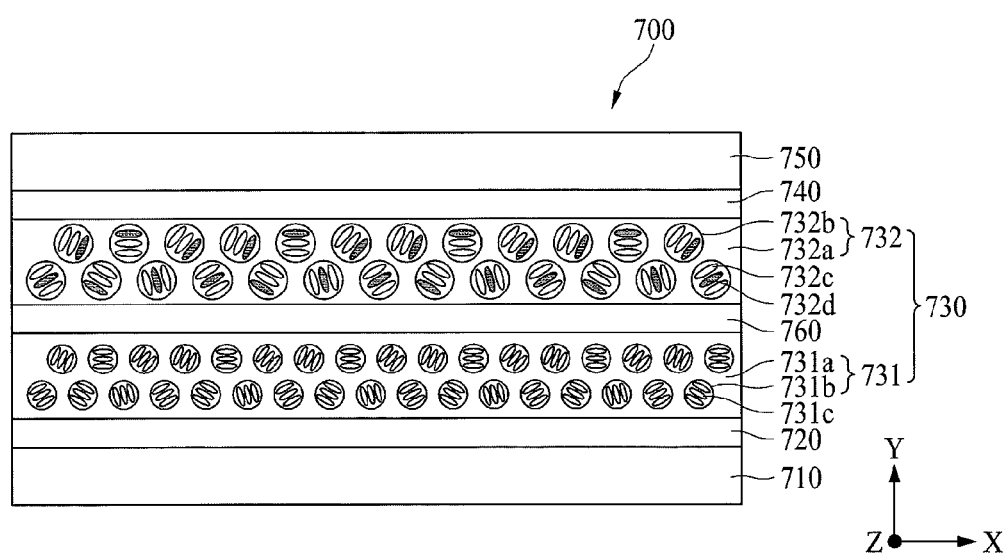

FIG. 7D is a cross-sectional view illustrating still another detailed example of the light shielding apparatus of FIG. 1. As shown in FIG. 7D, a light shielding apparatus 700 according to still another embodiment of the present invention includes a first substrate 710, a first electrode 720, a plurality of liquid crystal layers 730, a second electrode 740, a second substrate 750, and a transparent adhesive layer 760.

The first substrate 710, the first electrode 720, the plurality of liquid crystal layers 730, the second electrode 740 and the second substrate 750 of FIG. 7D are substantially same as the first substrate 110, the first electrode 120, the plurality of liquid crystal layers 130, the second electrode 140, and the second substrate 150, which are described with reference to FIGS. 1 and 2. Therefore, a detailed description of the first substrate 710, the first electrode 720, the plurality of liquid crystal layers 730, the second electrode 740 and the second substrate 750 of FIG. 7D will be omitted.

The transparent adhesive layer 760 may be provided between the plurality of liquid crystal layers 730. That is, the transparent adhesive layer 760 may be provided between a first PDLC layer 731 and a second PDLC layer 732. At this time, the transparent adhesive layer 760 may be a transparent adhesive film such as an optically clear adhesive (OCA) for adhering the first PDLC layer 731 and the second PDLC layer 732 to each other. The transparent adhesive layer 760 may have a refractive index between the first PDLC layer 731 and the second PDLC layer 732 to prevent Fresnel reflection from being generated due to a difference in a refractive index between the first PDLC layer 731 and the second PDLC layer 732.

[Method of Fabricating a Light Shielding Apparatus]

Figure 8:
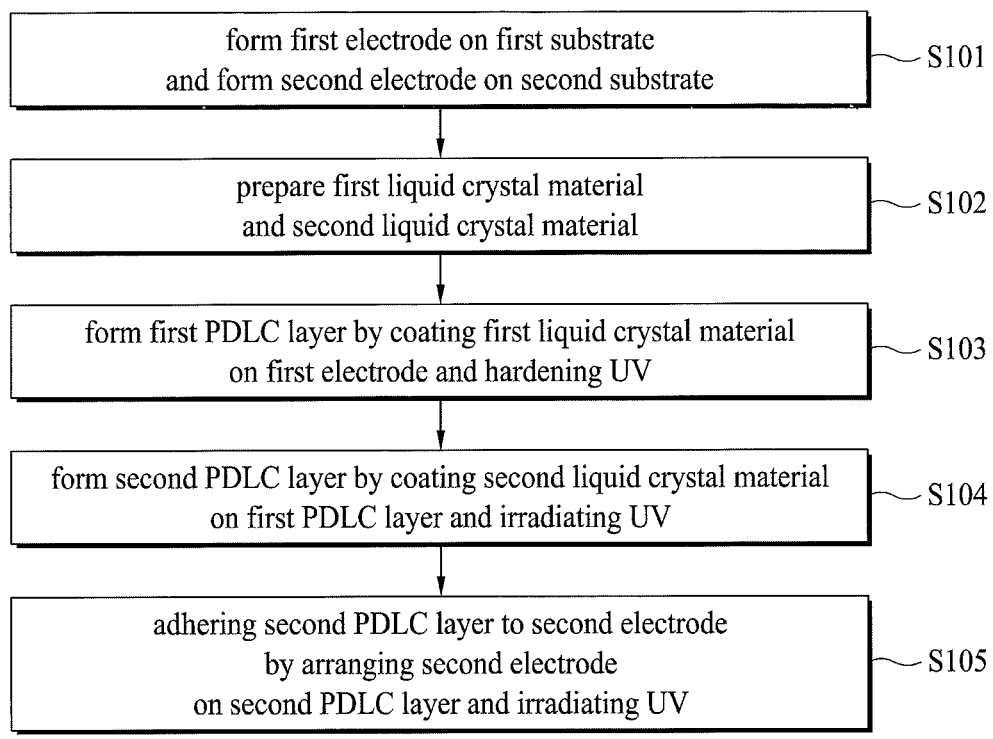
FIG. 8 is a flow chart illustrating a method of fabricating a light shielding apparatus according to one embodiment of the present invention.

FIG. 8 is a flow chart illustrating a method of fabricating a light shielding apparatus according to one embodiment of the present invention. FIGS. 9A to 9E are cross-sectional views illustrating a process of fabricating a light shielding apparatus according to one embodiment of the present invention. Hereinafter, a method of fabricating a light shielding apparatus according to one embodiment of the present invention will be described with reference to FIGS. 8 and 9A to 9E.

Figure 9A:
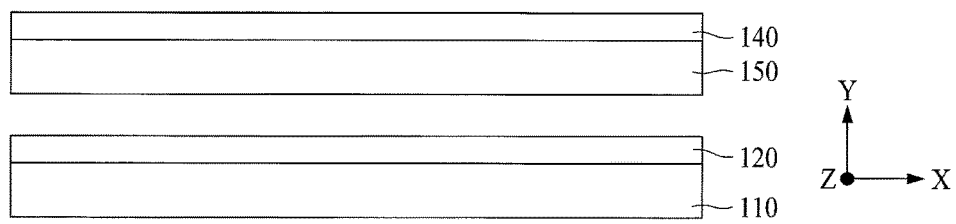
FIGS. 9A to 9E are cross-sectional views illustrating a process of fabricating a light shielding apparatus according to one embodiment of the present invention.

First of all, as shown in FIG. 9A, a first electrode 120 is formed on a first substrate 110, and a second electrode 140 is formed on a second substrate 150. Each of the first substrate 110 and the second substrate 150 may be a glass substrate or a plastic film. Each of the first and second electrodes 120 and 140 may be a transparent electrode (S101 of FIG. 8).

Figure 9B:
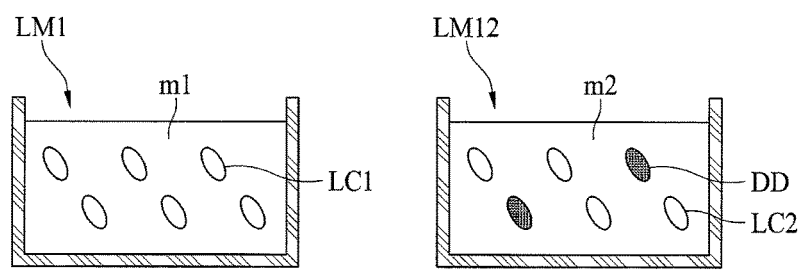

Second, as shown in FIG. 9B, a first monomer m1 is mixed with first liquid crystals LC1, whereby a first liquid crystal material LM1 of a liquid slate is prepared. At this time, a mixture ratio of the first monomer m1 and the first liquid crystals LC1 within the first liquid crystal material LM1 may be in the range of 40 wt %:60 wt % to 20 wt %:80 wt %. If a ratio of the first monomer m1 within the first liquid crystal material LM1 is 20 wt % or less, light shielding efficiency according to light scattering of the first liquid crystal material LM1 is reduced. Also, if the ratio of the first monomer m1 within the first liquid crystal material LM1 is 40 wt % or more, light transmittance ratio of the first liquid crystal material LM1 is reduced. Therefore, the mixture ratio of the first monomer m1 and the first liquid crystals LC1 may be set properly within the above range by considering light shielding efficiency or light transmissive efficiency. The first liquid crystal material LM1 may further include a photoinitiator.

Also, a second monomer m2 is mixed with second liquid crystals LC2 and first dichroic dyes DD, whereby a second liquid crystal material LM2 of a liquid state is prepared. At this time, a mixture ratio of the second monomer m2 and the second liquid crystals LC2 within the second liquid crystal material LM2 may be in the range of 40 wt %:60 wt % to 20 wt %:80 wt %. If a ratio of the second monomer m2 within the second liquid crystal material LM2 is 20 wt % or less, light shielding efficiency of light scattering and absorption by the second liquid crystal material LM2 is reduced. Also, if the ratio of the second monomer m2 within the second liquid crystal material LM2 is 40 wt % or more, light transmittance ratio of the second liquid crystal material LM2 is reduced. Therefore, the mixture ratio of the second monomer m2 and the second liquid crystals LC2 may be set properly within the above range by considering light shielding efficiency or light transmissive efficiency. The second liquid crystal material LM2 may further include a photoinitiator.

Also, the first dichroic dyes DD may be included in the second liquid crystal material LM2 in the range of 0.5 wt % to 5 wt %. In order to obtain light shielding efficiency by the first dichroic dyes DD in a light shielding mode, it is preferable that the first dichroic dyes DD are included in the second liquid crystal material LM2 in the range of 0.5 wt % or more. Meanwhile, since the first dichroic dyes DD absorb ultraviolet (hereinafter, referred to as "UV") if the UV is irradiated, the monomer included in the second liquid crystal material LM2 may not be partially hardened to a polymer. That is, if the amount of the first dichroic dyes DD is increased, the amount of the monomer remaining in the second PDLC layer 132 is increased by UV absorption of the first dichroic dyes DD. The non-hardened polymer remains as the monomer, thus exists as a floating material within a cell gap between the first substrate 110 and the second substrate 150, and may affect movement of the second PDLC layer 132 when a voltage is applied. Therefore, a problem may occur in that light transmittance ratio of the second PDLC layer 132 is reduced in the transparent mode due to the remaining monomer. As a result, it is preferable that the first dichroic dyes DD are included in the second liquid crystal material LM2 in the range of 5 wt % or less. (S102 of FIG. 8).

Figure 9C:
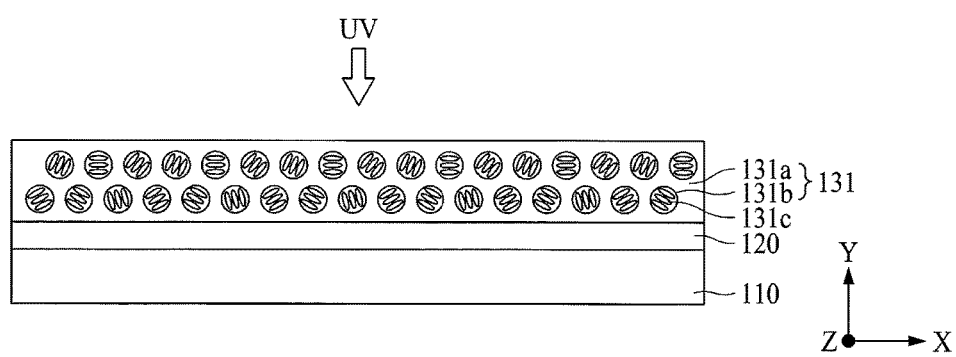

Third, as shown in FIG. 9C, the first liquid crystal material LM1 is coated on the first electrode 120, and UV is irradiated toward the first liquid crystal material LM1, whereby the first PDLC layer 131 is formed. A wavelength range of the UV irradiated to form the first PDLC layer 131 may be in the range of 10 nm to 400 nm, preferably in the range of 320 nm to 380 nm. The irradiation time of the UV may be 10 seconds to 60 minutes. In this case, UV intensity may be in the range of 10 mW/cm$^2$ to 50 mW/cm$^2$, preferably in the range of 10 mW/cm$^2$ to 20 mW/cm$^2$ (S103 of FIG. 8).

Figure 9D:
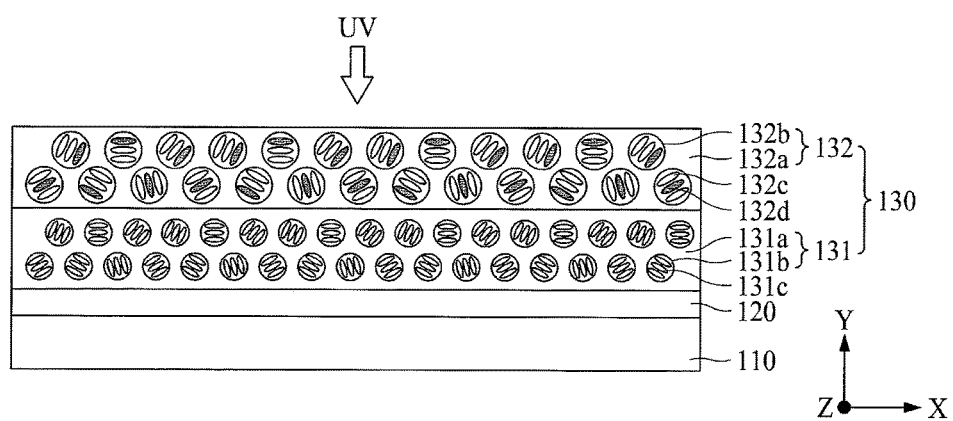

Fourth, as shown in FIG. 9D, the second liquid crystal material LM2 is coated on the first PDLC layer 131, and UV having energy smaller than that of UV irradiated to form the first PDLC layer 131 is irradiated to form a second PDLC layer 132. That is, the UV irradiated to form the second PDLC layer 132 has energy smaller than that of the UV irradiated to form the first PDLC layer 131.

The UV irradiation time may be maintained, and the UV intensity may be reduced, whereby UV energy may be reduced. For example, intensity of UV irradiated to form the second PDLC layer 132 may be in the range of 10 mW/cm$^2$ to 50 mW/cm$^2$, preferably in the range of 10 mW/cm$^2$ to 20 mW/cm$^2$. Alternatively, the UV intensity may be maintained, and the UV irradiation time may be reduced, whereby UV energy may be reduced. If the UV irradiation time for forming the second PDLC layer 132 is shorter than the UV irradiation time for forming the first PDLC layer 131, UV energy may be reduced. For example, the UV irradiation time for forming the second PDLC layer 132 may be 10 seconds to 30 minutes.

As a result, UV irradiation energy of the first PDLC layer 131 and UV irradiation energy of the second PDLC layer 132 may be provided differently from each other, whereby a size of droplets of the second PDLC layer 132 may be greater than a size of droplets of the first PDLC layer 131. Therefore, light shielding may be realized by light scattering of the first PDLC layer 131 and light absorption of the dyes of the second PDLC layer 132. And, if the size of the droplets of the second PDLC layer 132 is different from the size of the droplets of the first PDLC layer 131, light absorption of the dyes may be minimized in the transparent mode, and transmittance may be improved (S104 of FIG. 8).

Figure 9E:
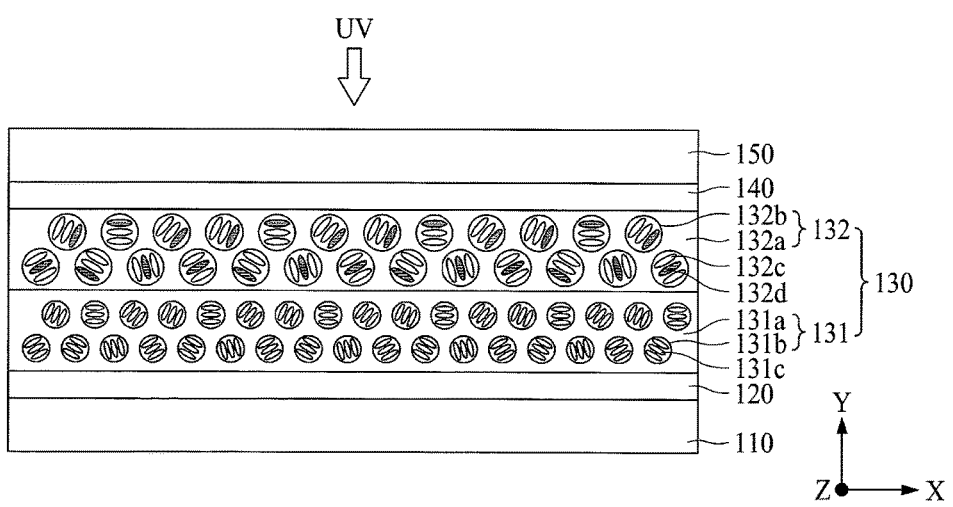

Fifth, as shown in FIG. 9E, the second electrode 140 of the second substrate 150 is arranged on the second PDLC layer 132, and UV is irradiated to bond the second PDLC layer 132 to the second substrate 150 that includes the second electrode 140. In this case, the UV irradiated for adhering has energy smaller than energy of UV irradiated to form the second PDLC layer 132.

The UV intensity may be maintained, and the UV irradiation time may be reduced, whereby the UV energy may be reduced. For example, the UV irradiation time for adhering may be 10 seconds to 10 minutes. Alternatively, the UV irradiation time may be maintained, and the UV intensity may be reduced, whereby the UV energy may be reduced. For example, intensity of the UV irradiated for adhering may be in the range of 10 mW/cm$^2$ to 50 mW/cm$^2$, preferably in the range of 10 mW/cm$^2$ to 20 mW/cm$^2$ (S105 of FIG. 8).

Figure 10:
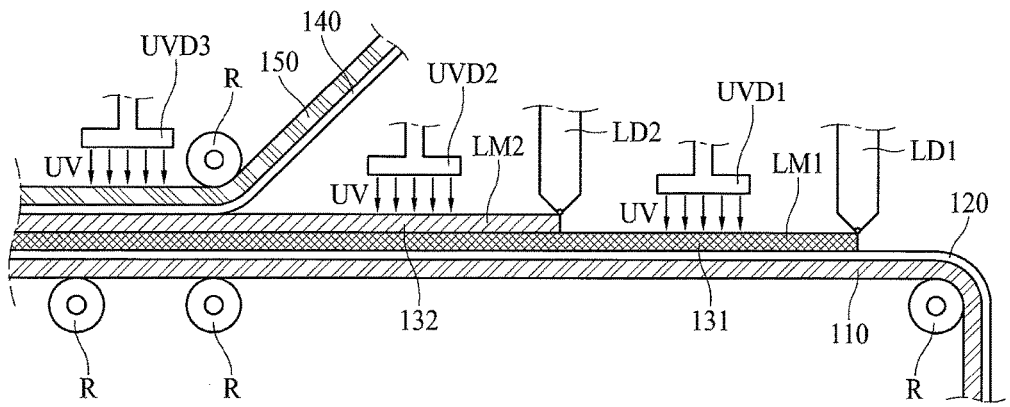
FIG. 10 is a cross-sectional view illustrating another process of fabricating a light shielding apparatus according to one embodiment of the present invention.

Meanwhile, the steps S103 to S105 of FIG. 8 may be performed by a Roll to Roll manner as shown in FIG. 10. Referring to FIG. 10, first of all, the first substrate 110 provided with the first electrode 120 is moved by rollers R, and a first liquid crystal material injecting device LD1 coats the first liquid crystal material LM1 on the first electrode 120. A first UV irradiating device UVD1 irradiates UV to the first liquid crystal material LM1 coated on the first electrode 120, whereby the first PDLC layer 131 is formed. The UV energy irradiated to form the first PDLC layer 131 is same as that described with reference to FIG. 9C.

Second, the first substrate 110 provided with the first PDLC layer 131 is moved by rollers R, and a second liquid crystal material injecting device LD2 coats the second liquid crystal material LM2 on the first PDLC layer 131. A second UV irradiating device UVD2 irradiates UV to the second liquid crystal material LM2 coated on the first PDLC layer 131, whereby the second PDLC layer 132 is formed. It is preferable that the second PDLC layer 132 is formed by controlling and semi-hardening the UV energy. The UV energy irradiated to form the second PDLC layer 132 is same as that described with reference to FIG. 9d.

Third, the first substrate 110 provided with the first PDLC layer 131 and the second PDLC layer 132 is moved by rollers R, and may be bonded to the second substrate 150 provided with the second electrode 140 as shown in FIG. 10. At this time, a third UV irradiating device UVD3 may fully harden the second PDLC layer 132 by irradiating UV after the first substrate 110 and the second substrate 150 are bonded to each other. The UV energy irradiated for adhering is the same as that described with reference to FIG. 9E.

Fourth, the first and second substrates 110 sad 150 which are bonded to each other may be cut, whereby the light shielding apparatus 100 may be fabricated.

As described above, the light shielding apparatus 100 shown in FIG. 2 may be completed in accordance with the fabricating method according to one embodiment of the present invention, which is shown in FIG. 8, FIGS. 9A to 9E or FIG. 10. Also, the light shielding apparatuses 200, 300, 400, 500, 600 and 700 according to the other embodiments of shown in FIGS. 6A and 6B and 7A to 7D may be fabricated in accordance with the fabricating method according to one embodiment of the present invention, which is shown in FIG. 8, FIGS. 9A to 9E or FIG. 10.

Also, in the embodiment(s) of the present invention, the liquid crystal material is not injected between the first substrate 110 and the second substrate 150 but coated on the first substrate 110 or the second substrate 150 and hardened using UV. Therefore, in the embodiment of the present invention, the fabricating process may be simplified, whereby the cost may be reduced.

Figure 11:
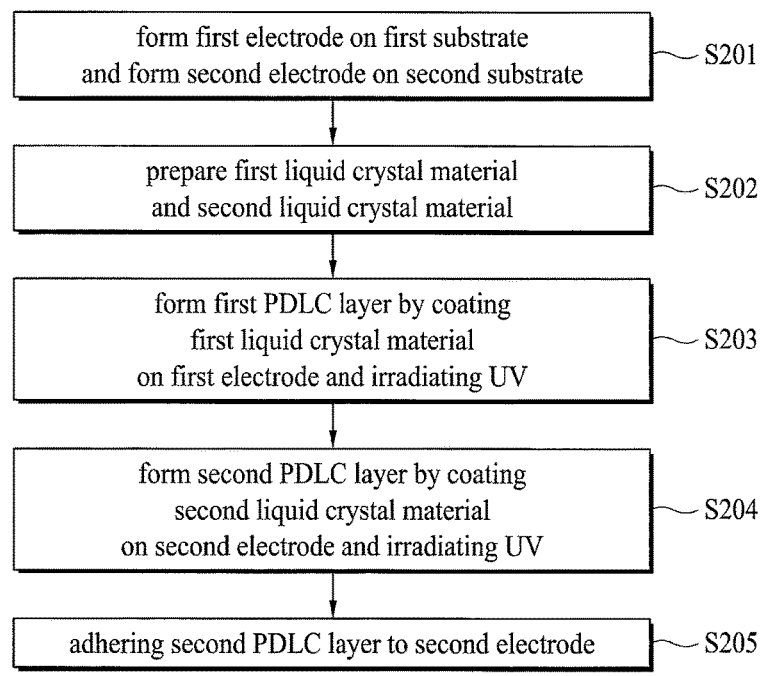
FIG. 11 is a flow chart illustrating a method of fabricating a light shielding apparatus according to another embodiment of the present invention.

FIG. 11. is a flow chart illustrating a method of fabricating a light shielding apparatus according to another embodiment of the present invention. FIGS. 12A to 12F are cross-sectional views illustrating other processes of fabricating a light shielding apparatus according to another embodiment of the present invention. Hereinafter, a method of fabricating a light shielding apparatus according to another embodiment of the present invention will be described with reference to FIGS. 11 and 12A to 12F.

Figure 12A:
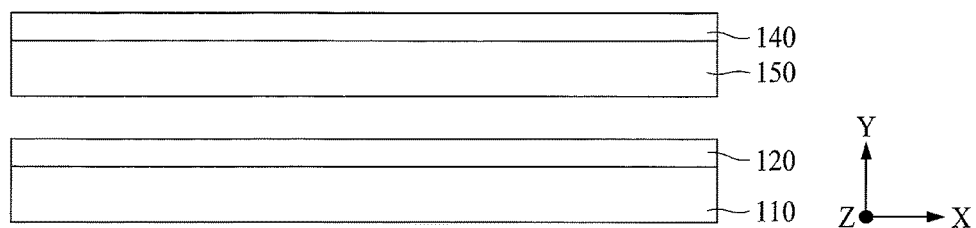
FIGS. 12A to 12F are cross-sectional views illustrating other processes of fabricating a light shielding apparatus according to another embodiment of the present invention.

First of all, as shown in FIG. 12A, a first electrode 120 is formed on a first substrate 110, and a second electrode 140 is formed on a second substrate 150. Each of the first substrate 110 and the second substrate 150 may be a glass substrate or a plastic film. Each of the first and second electrodes 120 and 140 may be, but not limited to, a transparent electrode (S201 of FIG. 11).

Figure 12B:
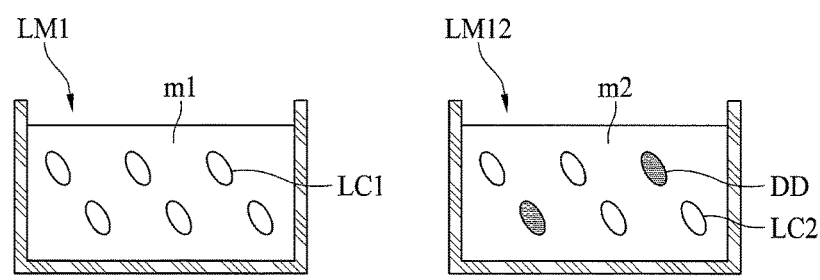

Second, as shown in FIG. 12B, a first monomer m1 is mixed with first liquid crystals LC1, whereby a first liquid crystal material LM1 of a liquid state is prepared. If a ratio of the first monomer m1 within the first liquid crystal material LM1 is 20 wt % or less, the first liquid crystal material LM1 scatters light, whereby light shielding efficiency is reduced. Also, if the ratio of the first monomer m1 within the first liquid crystal material LM1 is 40 wt % or more, light transmittance ratio of the first liquid crystal material LM1 is reduced. Therefore, the mixture ratio of the first monomer m1 and the first liquid crystals LC1 may be set properly within the above range by considering light shielding efficiency or light transmissive efficiency. The first liquid crystal material LM1 may further include a photoinitiator.

Also, a second monomer m2 is mixed with second liquid crystals LC2 and first dichroic dyes DD, whereby a second liquid crystal material LM2 of a liquid state is prepared. At this time, a mixture ratio of the second monomer m2 and the second liquid crystals LC2 may be in the range of 40 wt %:60 wt % to 20 wt %:80 wt %. If a ratio of the second monomer m2 within the second liquid crystal material LM2 is 20 wt % or less, the second liquid crystal material LM2 scatters and absorbs light, whereby light shielding efficiency is reduced. Also, if the ratio of the second monomer m2 within the second liquid crystal material LM2 is 40 wt % or more, light transmittance ratio of the second liquid crystal material LM2 is reduced. Therefore, the mixture ratio of the second monomer m2 and the second liquid crystals LC2 may be set properly within the above range by considering light shielding efficiency or light transmissive efficiency. The second liquid crystal material LM2 may further include a photoinitiator.

Also, the first dichroic dyes DD may be included in the second liquid crystal material LM2 in the range of 0.5 wt % to 5 wt %. In order to obtain light shielding efficiency by the first dichroic dyes DD in a light shielding mode, it is preferable that the first dichroic dyes DD are included in the second liquid crystal material LM2 in the range of 0.5 wt % or more. Meanwhile, since the first dichroic dyes DD absorb the ultraviolet (hereinafter, referred to as "UV") if the UV is irradiated, the monomer may not be partially hardened to a polymer. If the amount of the first dichroic dyes DD is increased, the amount of the monomer remaining in the second PDLC layer 132 is increased by UV absorption of the first dichroic dyes DD. The non-hardened polymer remains as the monomer, thus exists as a floating material within a cell gap between the first substrate 110 and the second substrate 150, and may affect movement of the second PDLC layer 132 when a voltage is applied. Therefore, a problem may occur in that light transmittance ratio of the second PDLC layer 132 is reduced in the transparent mode due to the remaining monomer. As a result, it is preferable that the first dichroic dyes DD are included in the second liquid crystal material LM2 in the range of 5 wt % or less (S202 of FIG. 11).

Figure 12C:
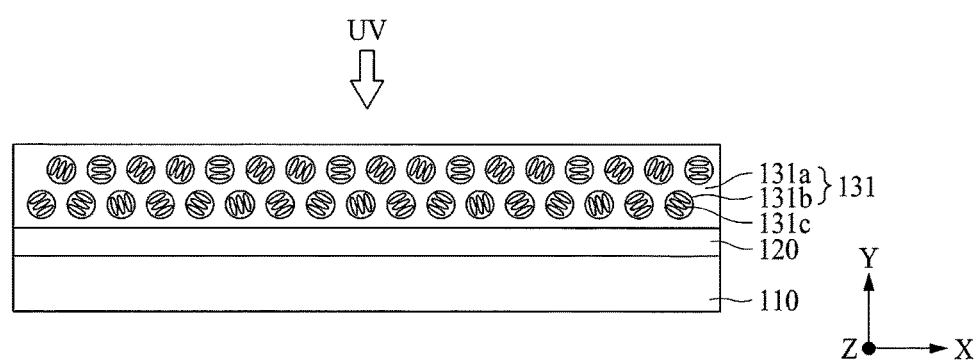

Third, as shown in FIG. 12C, the first liquid crystal material LM1 is coated on the first electrode 120, and UV is irradiated toward the first liquid crystal material LM1, whereby the first PDLC layer 131 is formed. A wavelength range of the UV may be in the range of 10 nm to 400 nm, preferably in the range of 320 nm to 380 nm. The irradiation time of the UV may be 10 seconds to 60 minutes. In this case, UV intensity may be in the range of 10 mW/cm$^2$ to 50 mW/cm$^2$, preferably in the range of 10 mW/cm$^2$ to 20 mW/cm$^2$ (S203 of FIG. 11).

Figure 12D:
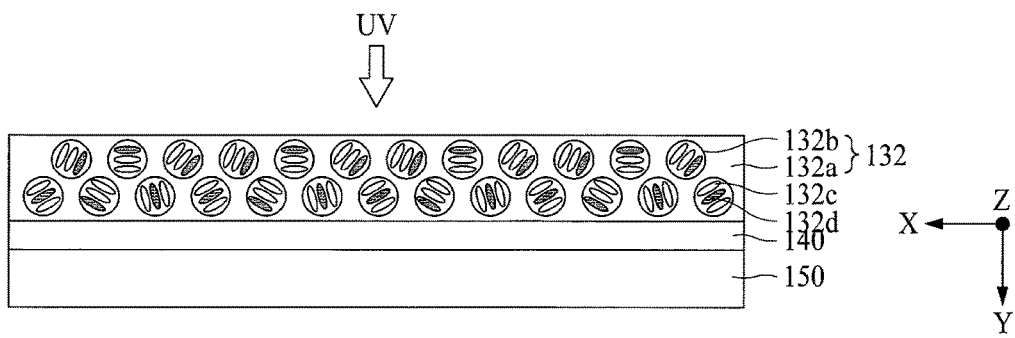

Fourth, as shown in FIG. 12D, the second liquid crystal material LM2 is coated on the second electrode 140, and UV is Irradiated to form a second PDLC layer 132. The UV wavelength range may be in the range of 10 nm to 400 nm, and the UV irradiation time may be 10 seconds to 30 minutes. In this case, the UV intensity may be in the range of 50 mW/cm$^2$, preferably in the range of 10 mW/cm$^2$ to 20 mW/cm$^2$. In order to irradiate UV at energy smaller than that irradiated to form the first PDLC layer 131, the UV intensity may be reduced or the UV irradiation time may be reduced.

The UV intensity may be maintained, and the UV irradiation time may be reduced, whereby the UV energy may be reduced. Therefore, the UV irradiation time for the second PDLC layer 132 is shorter than the UV irradiation time for the first PDLC layer 131, whereby UV energy irradiated to the second PDLC layer 132 may be reduced as compared with the UV energy irradiated to the first PDLC layer 131. For example, the UV irradiation time for the second PDLC layer 132 may be 10 seconds to 30 minutes. Alternatively, the UV irradiation time may be maintained, and the UV intensity may be reduced, whereby the UV energy may be reduced. Therefore, the UV intensity for the second PDLC layer 132 is more reduced than the UV intensity for the first PDLC layer 131, whereby the UV energy irradiated to the second PDLC layer 132 may be more reduced than the UV energy irradiated to the first PDLC layer 131.

Therefore, UV irradiation energy of the first PDLC layer 131 and UV irradiation energy of the second PDLC layer 132 may be provided differently from each other, whereby a size of droplets of the second PDLC layer 132 may be greater than a size of droplets of the first PDLC layer 131. As a result, light shielding may be realized by light scattering of the first PDLC layer 131 and light absorption of the dyes of the second PDLC layer 132. And, if the size of the droplets of the second PDLC layer 132 is different from the size of the droplets of the first PDLC layer 131, light absorption of the dyes may be minimized in the transparent mode, and transmittance may be improved (S204 of FIG. 11).

Figure 12E:
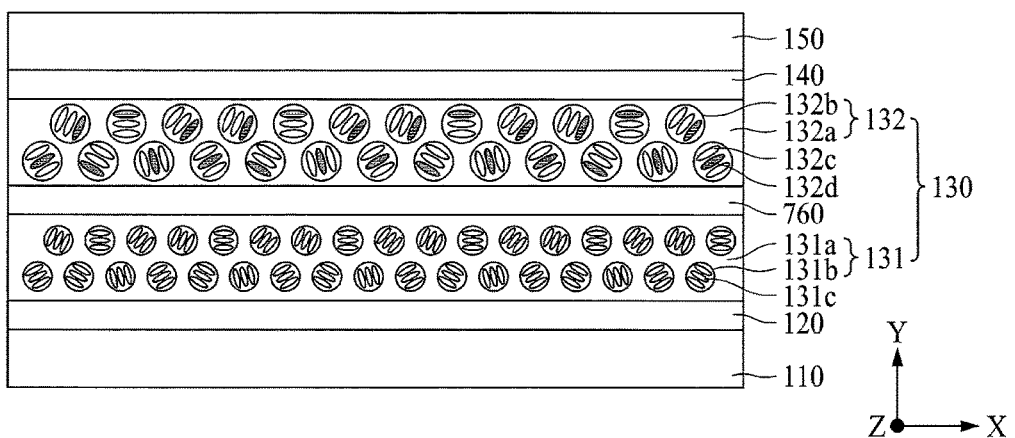

Fifth, as shown in FIG. 12E, the first PDLC layer 131 and the second PDLC layer 132 are bonded to each other by a transparent adhesive layer 760. In this case, the transparent adhesive layer 760 may be a transparent adhesive film such as OCA (optically clear adhesive) or a monomer included in the first liquid crystal material LM1 and the second liquid crystal material LM2. If the transparent adhesive layer 760 is a transparent adhesive film such as OCA, it is preferable that adhering of the first PDLC layer 131 and the second PDLC layer 132 is performed in a chamber of a vacuum state. If the transparent adhesive layer 760 is a monomer, it is preferable that the first PDLC layer 131 and the second PDLC layer 132 are bonded to each other by UV irradiation after the monomer is coated on the first PDLC layer 131 and the second PDLC layer 132 is arranged on the coated monomer (S205 of FIG. 11).

Figure 12F:
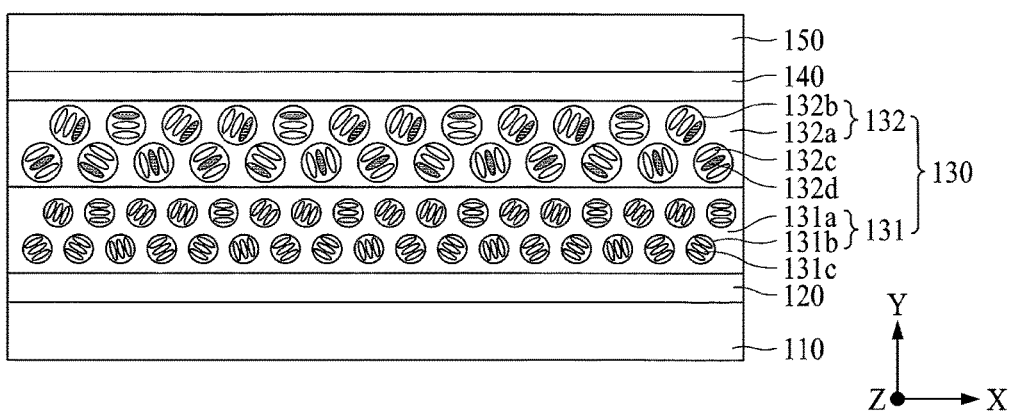

Meanwhile, the first PDLC layer 131 and the second PDLC layer 132 may be bonded to each other as shown in FIG. 12F. To this end, the first PDLC layer 131 is semi-hardened by UV irradiation at step S203, and the second PDLC layer 132 is semi-hardened by UV irradiation at Step S204. At step S205, the semi-hardened first PDLC layer 131 and the semi-hardened second PDLC layer 132 are hardened by UV irradiation. For this reason, the first PDLC layer 131 and the second PDLC layer 132 may be bonded to each other without the transparent adhesive layer 760 as shown in FIG. 12F. In this case, semi-hardening of the first PDLC layer 131 indicates that the first PDLC layer 131 is hardened in the range that the material of the first PDLC layer 131 is not permeated into the second PDLC layer 132 when the second PDLC layer 132 is arranged on the first PDLC layer 131. And, semi-hardening of the second PDLC layer 132 indicates that the second PDLC layer 132 is hardened in the range that the material of the second PDLC layer 132 is not permeated into the first PDLC layer 131 when the first PDLC layer 131 is arranged on the second PDLC layer 132.

Also, the steps S203 to S205 of FIGS. 11 and 12C to 12F may be performed by a Roll to Roll manner described with reference to FIGS. 8 and 10.

As described above, the light shielding apparatus 100 shown in FIG. 2 may be completed in accordance with the fabricating method according to another embodiment of the present invention, which is shown in FIG. 11 and FIGS. 12A to 12F. Also, the light shielding apparatuses 200, 300, 400, 500, 600 and 700 according to the other embodiments of shown in FIGS. 6A and 6B and 7A to 7D may be fabricated in accordance with the fabricating method according to the embodiment of the present invention, which is shown in FIGS. 11 and FIGS. 12A to 12F.

Also, in the embodiment(s) of the present invention, the liquid crystal material is not injected between the first substrate 110 and the second substrate 150 but coated on the substrate and hardened using UV. Therefore, in the embodiment of the present invention, the fabricating process may be simplified, whereby the cost may be reduced.

[Transparent Display Device]

Figure 13:
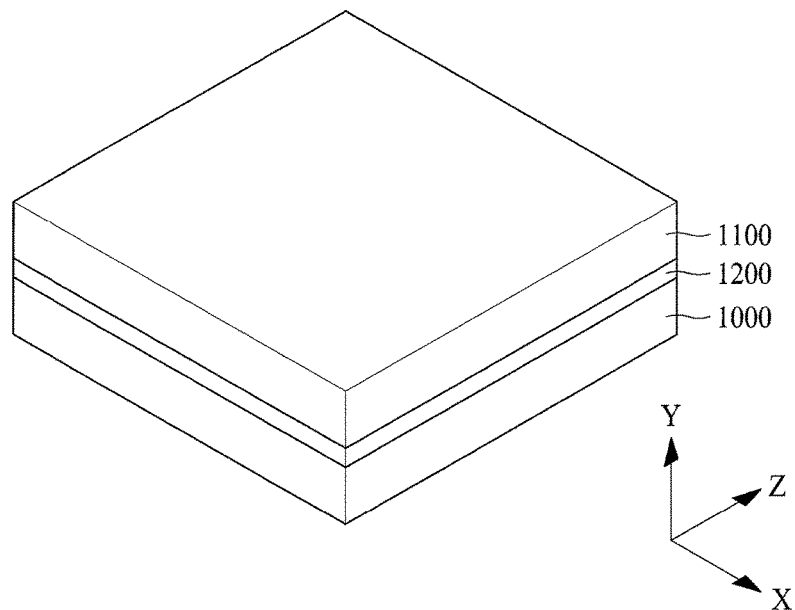
FIG. 13 is a perspective view illustrating a transparent display device according to one embodiment of the present invention.

FIG. 13 is a perspective view illustrating a transparent display device according to one embodiment of the present invention. Referring to FIG. 13, the transparent display device includes a light shielding apparatus 1000, a transparent display panel 1100, and an adhesive layer 1200. All the components of the transparent display device in this and other embodiments are operatively coupled and configured.

The light shielding apparatus 1000 may be realized as any one of the light shielding apparatuses 100, 200, 300, 400, 500, 600 and 700 according to the embodiments of the present invention described with reference to FIGS. 1, 2, 6A, 6B, and 7A to 7D. Therefore, the light shielding apparatus 1000 may shield the incident light in the light shielding mode and transmit the incident light in the transparent mode. The light shielding apparatus 1000 may allow its rear background not to be displayed by displaying a specific color in accordance with dichroic dyes, whereby the light shielding apparatus 1000 may be realized to provide a user with aesthetic sense in addition to a light shielding function.

Figure 14:
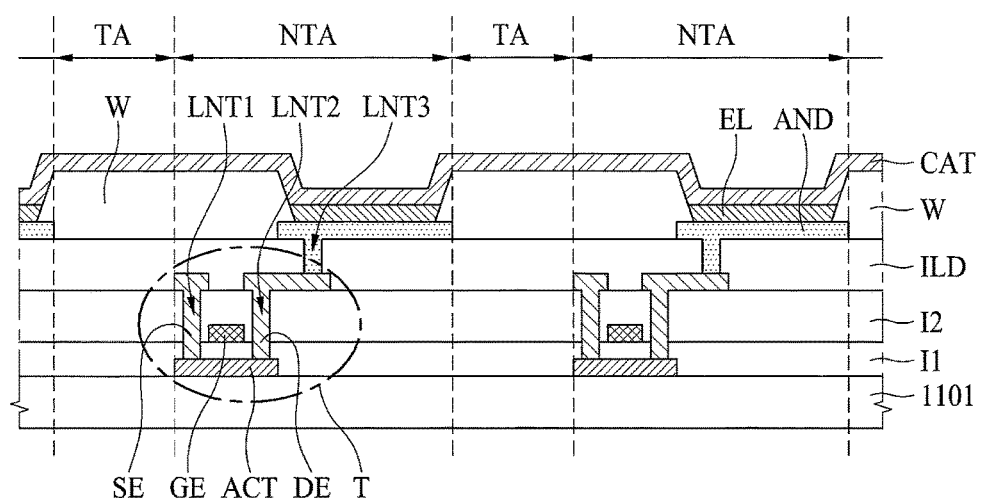
FIG. 14 is a cross-sectional view illustrating a detailed example of a lower substrate of a transparent display panel of FIG. 13.

The transparent display panel 1100 includes a transmissive area TA and a non-transmissive area NTA as shown in FIG. 14. Pixels P displaying an image are provided in the non-transmissive area NTA. Each of the pixels P may be provided with a transistor device T, an anode electrode AND, an organic layer EL, and a cathode electrode CAT as shown in FIG. 14. The non-transmissive area NTA may be referred to as an emissive area.

The transistor device T includes an active layer ACT provided on a lower substrate 1101, a first insulating film I1, provided on the active layer ACT, a gate electrode GE provided on the first insulating film I1, a second insulating film I2 provided on the gate electrode GE, and source and drain electrodes SE and DE provided on the second insulating film I2 and coupled to the active layer ACT through first and second contact holes CNT1 and CNT2. Although the transistor device T is formed in a top gate type in FIG. 14, the transistor device T may be formed in a bottom gate type without limitation to the top gate type.

The anode electrode AND is coupled to the drain electrode DE of the transistor device T through a third contact hole CNT3 that passes through an inter layer dielectric ILD provided on the source and drain electrodes SE and DE. A barrier is provided between the anode electrodes AND adjacent to each other, whereby the anode electrodes AND adjacent to each other may be insulated electrically.

The organic layer EL is provided on the anode electrode AND. The organic layer EL may include a hole transporting layer, an organic light emitting layer, and an electrode transporting layer.

The cathode electrode CAT is provided on the organic layer EL and the barrier W. If a voltage is applied to the anode electrode AND and the cathode electrode CAT, holes and electrons are moved to an organic light emitting layer through the hole transporting layer and the electron transporting layer and combined with each other in the organic light emitting layer to emit light.

Although the transparent display panel 1100 is formed in a bottom emission type in FIG. 14, the transparent display panel 1100 may be formed in a top emission type or dual emission type without limitation to the bottom emission type. If the transparent display panel 1100 is formed in a top emission type, it is preferable that the light shielding apparatus 1000 is arranged below the lower substrate 1101. If the transparent display panel 1100 is formed in a bottom emission type, it is preferable that the light shielding apparatus 1000 is arranged on an upper substrate.

The adhesive layer 1200 bonds the light shielding apparatus 1000 and the transparent display panel 1100 to each other. The adhesive layer 1200 may be a transparent adhesive film such as an optically clear adhesive (OCA). One surface of the adhesive layer 1200 may be bonded to a surface below the lower substrate 1101 of the transparent display panel 1100 or bonded onto the upper substrate, and the other surface of the adhesive layer 1200 may be bonded to the light shielding apparatus 1000. If the adhesive layer 1200 is realized as a transparent adhesive film such as OCA, the adhesive layer 1200 may have a refractive index between 1.4 and 1.9.

Also, the lower substrate 1101 or the upper substrate of the transparent display panel 1100 may be a second substrate of the light shielding apparatus 1000. In this case, the second electrode 140 of the light shielding apparatus 1000 may be provided on the lower substrate 1101 or the upper substrate of the transparent display panel 1100.

The transparent display panel 1100 may be realized in a display mode in which pixels P display an image and a non-display mode in which pixels P do not display an image. If the transparent display panel 1100 is realized in a display mode in which pixels P display an image, the light shielding apparatus 1000 may be realized in a light shielding mode for shielding the light incident through a rear surface of the transparent display panel 1100 to increase qualify of the image.

In the non-display mode in which pixels P do not display an image, the light shielding apparatus 1000 may be realized in a light shielding mode or a transparent mode. In the non-display mode in which pixels P do not display an image, if the light shielding apparatus 1000 is realized in a light shielding mode, the transparent display device is seen to a user as a black color. In the non-display mode in which pixels P do not display an image, if the light shielding apparatus 1000 is realized in a transparent mode, the transparent display device is realized transparently, whereby the user may see a rear background of the transparent display device through the transparent display device.

Figure 15:
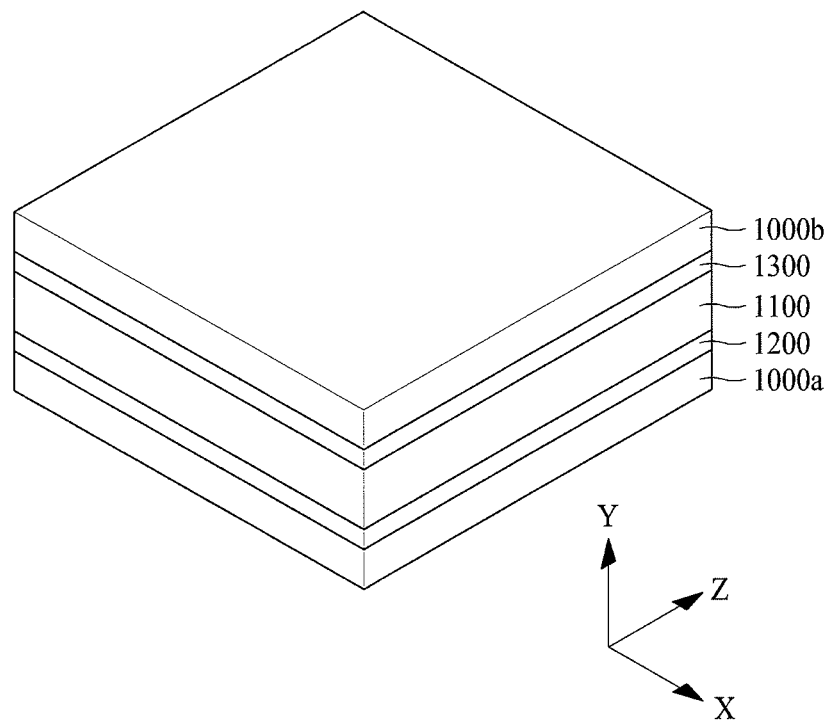
FIG. 15 is a perspective view illustrating a transparent display device according to another embodiment of the present invention.

FIG. 15 is a perspective view illustrating a transparent display device according to another embodiment of the present invention. Referring to FIG. 15, the transparent display device includes a light shielding apparatus 1000a, a second light shielding apparatus 1000b, a transparent display panel 1100, a first adhesive layer 1200, and a second adhesive layer 1300.

Each of the first and second light shielding apparatuses 1000a and 1000b may be realized as any one of the light shielding apparatuses 100, 200, 300, 400, 500, 600 and 700 according to the embodiments of the present invention described with reference to FIGS. 1, 2, 6A, 6B and 7A to 7D. Therefore, each of the first and second light shielding apparatuses 1000a and 1000b may shield the incident light in the light shielding mode and transmit the incident light in the transparent mode. Each of the first and second light shielding apparatuses 1000a and 1000b may be realized to provide a user with esthetic effect in addition to a light shielding function in accordance with dichroic dyes.

The transparent display panel 1100 is substantially same as that described with reference to FIGS. 13 and 14. Therefore, a detailed description of the transparent display panel 1100 of FIG. 15 will be omitted.

The first adhesive layer 1200 bonds the first light shielding apparatus 1000a and the transparent display panel 1100 to each other. The first adhesive layer 1200 may be a transparent adhesive film such as an optically clear adhesive (OCA). One surface of the first adhesive layer 1200 may be bonded to a surface below a lower substrate 1101 of the transparent display panel 1100 or bonded onto an upper substrate, and the other surface of the first adhesive layer 1200 may be bonded to the first light shielding apparatus 1000a. If the first adhesive layer 1200 is realized as a transparent adhesive film such as OCA, the first adhesive layer 1200 may have a refractive index between 1.4 and 1.9.

The second adhesive layer 1300 bonds the second light shielding apparatus 1000b and the transparent display panel 1100 to each other. The second adhesive layer 1300 may be a transparent adhesive film such as an optically clear adhesive (OCA). One surface of the second adhesive layer 1300 may be bonded to a surface below the lower substrate 1101 of the transparent display panel 1100 or bonded onto the upper substrate, and the other surface of the second adhesive layer 1300 may be bonded to the second light shielding apparatus 1000b. If the second adhesive layer 1300 is realized as a transparent adhesive film such as OCA, the second adhesive layer 1300 may have a refractive index, between 1.4 and 1.9.

The transparent display panel 1100 may be realized in a display mode in which pixels P display an image and a non-display mode in which pixels P do not display an image. It is assumed that a user views an image through the second light shielding apparatus 1000b. In this case, if the transparent display panel 1100 is realized in a display mode in which pixels P display an image, the first light shielding apparatus 1000a may be realized in a light shielding mode for shielding the light incident through a rear surface of the transparent display panel 1100 to increase quality of the image, and the second light shielding apparatus 1000b is preferably realized in a transparent mode.

In the non-display mode in which pixels P do not display an image, the first and second light shielding apparatuses 1000a and 1000b may be realized in a light shielding mode or a transparent mode. In the non-display mode in which pixels P do not display an image, if the first and second light shielding apparatuses 1000a and 1000b are realized in a light shielding mode, the transparent display device is seen to a user as a black color. In the non-display mode in which pixels P do not display an image, if the first and second light shielding apparatuses 1000a and 1000b are realized in a transparent mode, the transparent display device is realized transparently, whereby the user may see a rear background of the transparent display device through the transparent display device.

Meanwhile, the transparent display panel 1100 may be provided as a dual transparent display panel that may display an image in dual directions. In a display mode in which the dual transparent display panel displays an image in dual directions, if the first and second light shielding apparatuses 1000a and 1000b are realized in a transparent mode, users may view the image in dual directions. Also, in a display mode in which the dual transparent display panel displays an image in dual directions, if any one of the first and second light shielding apparatuses 1000a and 1000b is realized in a light shielding mode, the corresponding light shielding apparatus may prevent the user from watching the image in any one direction of the dual directions.

As described above, according to one or more embodiments of the present invention, the following advantages may be obtained.

In one or more embodiments of the present invention, the plurality of polymer dispersed liquid crystal (PDLC) layers are provided to obtain higher light transmittance ratio in the transparent mode and higher light shielding efficiency in the light shielding mode than those of a single polymer dispersed liquid crystal (PDLC) layer.

Also, in one or more embodiments of the present invention, light transmittance ratio may be increased in the transparent mode and light shielding efficiency may be increased in the light shielding mode by controlling the size of droplets included in the plurality of polymer dispersed liquid crystal (PDLC) layers. Also, the sixe of the droplets of the second PDLC layer may be greater than the size of the droplets of the first PDLC layer, whereby light transmittance ratio in the transparent mode may be increased.

Also, in one or more embodiments of the present invention, since the plurality of PDLC layers are provided, the amount of the dichroic dyes included in the plurality of PDLC layers may be more reduced than the amount of the dichroic dyes included in a single PDLC layer, whereby light transmittance ratio in the transparent mode may be reduced.

Also, in one or more embodiments of the present invention, since the light shielding apparatus may display a specific color in accordance with the dichroic dyes to allow its rear background not to be seen, esthetic effect in addition to the light shielding function may be provided to a user.

Also, in one or more embodiments of the present invention, since the other portions except the droplets of the plurality of PDLC layers exist at a solid state, a cell gap may be maintained even without spacers or walls. Therefore, the fabricating process may be simplified, and the fabricating cost may be reduced.

Also, in one or more embodiments of the present invention, since the liquid crystal material is not injected between the first substrate and the second substrate but coated on the substrate and hardened using UV, the fabricating process may be simplified, whereby the cost may be reduced.

Also, in one or more embodiments of the present invention, the light shielding apparatus, which includes a plurality of PDLC layers to realize high light transmittance ratio in the transparent mode and high light shielding efficiency in the light shielding mode, may be applied to the transparent display device. Also, in the display mode in which pixels of the transparent display panel display an image, if the light shielding apparatus is realized in the light shielding mode for shielding the light incident upon the rear surface of the transparent display panel, quality of the image displayed by the transparent display panel may be increased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light shielding apparatus comprising:
   first and second substrates facing each other;
   a first electrode on the first substrate;
   a second electrode on the second substrate; and
   first and second polymer dispersed liquid crystal layers between the first electrode and the second electrode, wherein the first polymer dispersed liquid crystal layer includes first droplets having first liquid crystals and lacking dichroic dyes wherein the second polymer dispersed liquid crystal layer includes second droplets having first dichroic dyes and second liquid crystals, the second liquid crystals lacking dichroic dyes, wherein each of the second droplets has a size greater than that of each of the first droplets, wherein the each of the second droplets has a size smaller than five times of that of the each of the first droplets, wherein external lights incident onto the first substrate firstly reach the first polymer dispersed liquid crystal layer among the first and second polymer dispersed liquid crystal layers and exit through the second substrate after passing through the second polymer dispersed liquid crystal layer, wherein the first and second polymer dispersed liquid crystal layers are realized in a transparent mode for transmitting incident light through the light shielding apparatus, when a difference between a first voltage applied to the first electrode and a second voltage applied to the second electrode is greater than a second threshold voltage, and wherein a number of the second liquid crystals lacking dichroic dyes is greater than a number of the first dichroic dyes in each of the second droplets.

2. The light shielding apparatus of claim 1, wherein the first and second polymer dispersed liquid crystal layers are realized in a light shielding mode for shielding incident light, when no voltage is applied to each of the first and second electrodes or when a difference between the first voltage applied to the first electrode and the second voltage applied to the second electrode is smaller than a first threshold voltage.

3. The light shielding apparatus of claim 2, further comprising a third polymer dispersed liquid crystal layer between the first electrode and the second electrode.

4. The light shielding apparatus of claim 3, wherein the third polymer dispersed liquid crystal layer includes third droplets having third liquid crystals and second dichroic dyes.

5. The light shielding apparatus of claim 4, wherein the third droplets have a size greater than that of the first droplets.

6. The light shielding apparatus of claim 3, wherein the third polymer dispersed liquid crystal layer includes third droplets having third liquid crystals.

7. The light shielding apparatus of claim 6, wherein the third droplets have a size smaller than that of the second droplets.

8. The light shielding apparatus of claim 1, further comprising:
a first refractive index matching layer on an opposite surface of one surface of the first substrate having the first electrode, the first refractive index matching layer having a refractive index between a refractive index of the first substrate and a refractive index of air; and
a second refractive index matching layer on an opposite surface of one surface of the second substrate having the second electrode, the second refractive index matching layer having a refractive index between a refractive index of the second substrate and the refractive index of the air.

9. The light shielding apparatus of claim 1, further comprising:
a first refractive index matching layer between the first substrate and the first electrode, the first refractive index matching layer having a refractive index between a refractive index of the first substrate and a refractive index of the first electrode; and
a second refractive index matching layer between the second substrate and the second electrode, the second refractive index matching layer having a refractive index between a refractive index of the second substrate and a refractive index of the second electrode.

10. The light shielding apparatus of claim 1, further comprising:
a first refractive index matching layer between the first electrode and the first polymer dispersed liquid crystal layer, the first refractive index matching layer having a refractive index between a refractive index of the first electrode and a refractive index of the first polymer dispersed liquid crystal layer; and
a second refractive index matching layer arranged between the second electrode and the second polymer dispersed liquid crystal layer, the second refractive index matching layer having a refractive index between a refractive index of the second electrode and a refractive index of the second polymer dispersed liquid crystal layer.

11. The light shielding apparatus of claim 1, further comprising a transparent adhesive layer assembling the first and second polymer dispersed liquid crystal layers to each other.

12. A display device comprising:
a display panel; and
at least one light shielding apparatus according to claim 1, which is attached to the display panel.

13. The display device according to claim 12, wherein the display panel is an OLED panel.

14. The display device according to claim 12, wherein each of the at least one light shielding apparatus is attached to a front surface of the display panel.

15. The display device according to claim 12, wherein each of the at least one light shielding apparatus is attached to a rear surface of the display panel.

* * * * *